(12) United States Patent
Choi et al.

(10) Patent No.: US 7,842,944 B2
(45) Date of Patent: Nov. 30, 2010

(54) ORGANIC LIGHT EMITTING DIODE DISPLAY

(75) Inventors: Joon-Hoo Choi, Seoul (KR); Jong-Moo Huh, Hwasung-si (KR); Joon-Chul Goh, Seoul (KR); Seung-Kyu Park, Hwaseong-si (KR); Kwang-Chul Jung, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 179 days.

(21) Appl. No.: 11/615,439

(22) Filed: Dec. 22, 2006

(65) Prior Publication Data

US 2007/0295962 A1 Dec. 27, 2007

(30) Foreign Application Priority Data

Jun. 21, 2006 (KR) .................. 10-2006-0055856

(51) Int. Cl.
*H01L 51/00* (2006.01)
(52) U.S. Cl. .............. 257/40; 257/59; 257/72
(58) Field of Classification Search ........... 257/40, 257/59, 72
See application file for complete search history.

(56) References Cited

U.S. PATENT DOCUMENTS

| 6,249,327 | B1 * | 6/2001 | Murade et al. ........ 349/43 |
| 6,777,887 | B2 | 8/2004 | Koyama |
| 7,342,247 | B2 * | 3/2008 | Lee et al. ............ 257/40 |
| 2005/0070055 | A1 * | 3/2005 | Kunii ............... 438/151 |
| 2005/0151830 | A1 * | 7/2005 | Yamazaki ............ 347/238 |
| 2006/0081849 | A1 | 4/2006 | Lee et al. |
| 2006/0270097 | A1 * | 11/2006 | Kim et al. ............ 438/82 |
| 2007/0120143 | A1 * | 5/2007 | Huh et al. ........... 257/103 |

FOREIGN PATENT DOCUMENTS

| JP | 2002-132184 | 5/2002 |
| JP | 2002-176063 | 6/2002 |
| JP | 2003-223120 | 8/2003 |
| JP | 2004-179138 | 6/2004 |
| JP | 2005-031648 | 2/2005 |
| KR | 1020040041982 | 5/2004 |
| KR | 1020050012957 | 2/2005 |
| KR | 1020050063109 | 6/2005 |
| KR | 1020050082959 | 8/2005 |
| KR | 1020050094074 | 9/2005 |
| KR | 1020050099339 | 10/2005 |

* cited by examiner

*Primary Examiner*—Marcos D Pizarro
*Assistant Examiner*—Tifney L Skyles
(74) *Attorney, Agent, or Firm*—Cantor Colburn LLP

(57) ABSTRACT

An organic light emitting diode ("OLED") display includes a substrate, a gate line, a data line, a driving voltage line, a light blocking member, a switching thin film transistor ("TFT"), a driving TFT, and an OLED, wherein the driving voltage line includes a portion parallel to at least one of the gate line and the data line, the light blocking member is formed under at least one of the gate line, the data line, and the driving voltage line, the switching TFT is connected to the gate line and the data line and includes an amorphous semiconductor, the driving TFT is connected to the switching TFT and includes a polycrystalline semiconductor, and the OLED is connected to the driving TFT.

23 Claims, 22 Drawing Sheets

FIG.4

| R | $\overline{W}$ | R | $\overline{W}$ | R |
|---|---|---|---|---|
| G | B | G | B | G |
| R | $\overline{W}$ | R | $\overline{W}$ | R |
| G | B | G | B | G |
| R | $\overline{W}$ | R | $\overline{W}$ | R |

ORGANIC LIGHT EMITTING DIODE DISPLAY

This application claims priority to Korean Patent Application No. 10-2006-0055856, filed on Jun. 21, 2006, and all the benefits accruing therefrom under 35 U.S.C. §119, the contents of which in its entirety are herein incorporated by reference.

BACKGROUND OF THE INVENTION (a) Field of the Invention

The present invention relates to an organic light emitting diode ("OLED") display and a method for manufacturing the same.

(b) Description of the Related Art

Recently, monitors and television sets have been required to be thinner and lighter. In order to satisfy such requirements, liquid crystal displays ("LCD") have replaced cathode ray tube ("CRT") displays.

However, an LCD requires an additional backlight because the LCD is a passive light emitting device. Also, the LCD has problems in terms of response speed and viewing angle.

In order to overcome the problems of the LCD, an organic light emitting diode ("OLED") display has being receiving attention.

The OLED display includes a light emitting layer interposed between two electrodes, one for injecting electrons and the other for injecting holes to the light emitting layer. The injected electrons and holes are coupled at the light emitting layer, and excitons are thereby formed. The excitons emit light while discharging energy.

The OLED display is itself a light emitting device which does not require an additional light source. Therefore, the OLED display has an advantage of low power consumption. Also, the response speed, the viewing angle, and the contrast ratio of the OLED display are superior.

The OLED display may be classified as a passive matrix OLED display or an active matrix OLED display according to the type of driving mechanism used therein.

The active matrix OLED display includes a switching thin film transistor connected to a signal line which controls a data voltage, and a driving thin film transistor which flows a current into a organic light emitting device by supplying the data voltage received from the switching thin film transistor as a gate voltage.

However, the switching thin film transistor and the driving thin film transistor require different characteristics to allow the OLED display to have optimal performance.

The switching thin film transistor requires a high on/off current ratio ($I_{on}/I_{off}$), while the driving thin film transistor requires high charge carrier mobility and stability for flowing sufficient and steady current to the organic light emitting device.

If the off-current increases at the switching thin film transistor, the data voltage transferred to the driving thin film transistor is reduced. As a result, cross-talk may arise. Cross-talk is the name for the undesirable effect where information (in the form of voltages) supplied to one row of pixels in the display can affect the image on other pixel rows. If the driving thin film transistor has lower carrier mobility and stability, the amount of current flowing into the organic light emitting device is reduced. As a result, the amount of light emitted from the organic light emitting device is reduced.

However, if the switching thin film transistor and the driving thin film transistor are independently manufactured to satisfy the different required characteristics of each transistor, the number of manufacturing processes and the number of masks would significantly increase. Further, the OLED display must use an additional polarizer to avoid significant degradation of the contrast ratio thereof due to a large amount of reflected external light.

BRIEF SUMMARY OF THE INVENTION

One aspect of the present invention provides an exemplary embodiment of an organic light emitting device display for simultaneously satisfying properties required by a switching thin film transistor and a driving thin film transistor without significantly increasing the number of manufacturing processes. Another aspect of the present invention is to provide an exemplary embodiment of an organic light emitting diode ("OLED") display with an improved contrast ratio.

The present invention provides an exemplary embodiment of an organic light emitting device display including; a substrate, a gate line formed on the substrate, a data line formed substantially parallel with the gate line, a driving voltage line including a portion parallel to at least one of the gate line and the data line, a light blocking member formed under at least one of the gate line, the data line, and the driving voltage line, a switching thin film transistor ("TFT") connected to the gate line and the data line and including an amorphous semiconductor, a driving TFT connected to the switching thin film transistor and including a crystalline semiconductor, and an OLED connected to the driving thin film transistor.

The light blocking member may include at least one of a first layer including an opaque conductive material and a second layer including an oxide of the opaque conductive material.

The opaque conductive material may be chromium (Cr).

The switching thin film transistor may further include a switching control electrode connected to the gate line, a switching input electrode connected to the data line, and a switching output electrode connected to the driving thin film transistor wherein the driving thin film transistor may further include a driving control electrode connected to the switching output electrode, a driving input electrode connected to the driving voltage line, and a driving output electrode connected to a pixel electrode, wherein the amorphous semiconductor may be formed on the switching control electrode, and the crystalline semiconductor may be formed under the driving control electrode.

Another exemplary embodiment of the present invention provides an OLED display including a substrate, a light blocking member formed on the substrate, a gate line formed on the light blocking member and including a switching control electrode, a first amorphous semiconductor formed on the switching control electrode, a data line including a switching input electrode, wherein the switching input electrode contacts the first amorphous semiconductor, and a switching output electrode which faces the switching input electrode, a driving control electrode connected to the switching output electrode, a first crystalline semiconductor formed on the substrate, a driving voltage line including a driving input electrode, wherein the driving input electrode contacts the first crystalline semiconductor, and a driving output electrode which faces the driving input electrode, a pixel electrode connected to the driving output electrode, a common electrode which faces the pixel electrode, and a light emitting member disposed between the pixel electrode and the common electrode.

The light blocking member may further include at least one of a first layer including an opaque conductive material and a second layer including an oxide of the opaque conductive material.

The opaque conductive material may be chromium (Cr).

The OLED display may further include a second crystalline semiconductor formed under the light blocking member and having substantially the same shape as the light blocking member.

The first amorphous semiconductor may have substantially the same shape as the data line and the switching output electrode and is also disposed between the switching input electrode and the switching output electrode.

The OLED display a may further include an etch stopper formed on the first crystalline semiconductor, wherein the etch stopper includes substantially the same material as the light blocking member.

The OLED display may further include a color filter formed between the substrate and the pixel electrode.

The light emitting member may include a plurality of light emitting layers, wherein each of the plurality of light emitting layers emit light of a different wavelength.

The different wavelengths of light may be combined to form white light.

The OLED display may further include an extension of the driving voltage line which is connected to the driving voltage line.

The OLED display may further include a second amorphous semiconductor formed under the extension of the driving voltage line, wherein the second amorphous semiconductor has substantially the same shape as the auxiliary driving voltage line.

The gate line, the driving voltage line, and the driving output electrode may be formed at the same time.

The switching output electrode, the driving control electrode, and the auxiliary driving voltage line may be formed at the same time.

Another exemplary embodiment of the present invention provides an OLED display including a first pixel and a second pixel adjacent to the first pixel, wherein the first pixel includes; a first switching thin film transistor connected to a gate line and a first data line, a first driving thin film transistor connected to the first switching thin film transistor and a driving voltage line, and a first light emitting diode connected to the first driving thin film transistor, and wherein the second pixel includes; a second switching thin film transistor connected to the gate line and a second data line, a second driving thin film transistor connected to the second switching thin film transistor and the driving voltage line, and a second light emitting diode connected to the second driving thin film transistor, wherein a light blocking member is formed on at least a portion of the gate line, the first data line, the second data line, and the driving voltage line.

At least one of the first switching thin film transistor and the second switching thin film transistor may include an amorphous semiconductor, and at least one of the first driving thin film transistor and the second driving thin film transistor may include a crystalline semiconductor.

The driving voltage line may include a first portion formed substantially parallel to the gate line, and a second portion which projects from the first portion and is disposed between the first and second data lines, wherein the first driving thin film transistor and the second driving thin film transistor are connect to the second portion.

The first pixel and the second pixel may be disposed substantially symmetrically with respect to the driving voltage line.

At least one of the first pixel and the second pixel may further include a color filter formed on at least one of the bottom of the first light emitting diode and the second light emitting diode.

At least one of the first light emitting diode and the second light emitting diode may emit white light.

According to another exemplary embodiment of the present invention, an exemplary embodiment of a method of manufacturing an exemplary embodiment of an OLED display includes forming a plurality of crystalline semiconductors and light blocking members on a substrate, forming a gate line, a driving voltage line having a driving input electrode, and a driving output electrode on the crystalline semiconductors and a driving output electrode, forming a plurality of amorphous semiconductors, a data line having a switching input electrode, a switching output electrode, and a driving control electrode on the gate line, the driving voltage line, and the driving output electrode, forming a passivation layer on the data line, the switching output electrode, and the driving control electrode, forming a first electrode connected to the driving output electrode on the passivation layer, forming a light emitting member on the first electrode, and forming a second electrode on the light emitting member.

The forming of the plurality of crystalline semiconductors and light blocking members on a substrate includes; forming a crystalline semiconductor layer on the substrate, forming a light blocking layer on the crystalline semiconductor layer, and photo-etching the crystalline semiconductor layer and the light blocking layer using a first mask.

The forming of the gate line, a driving voltage line having a driving input electrode, and a driving output electrode on the crystalline semiconductors and the light blocking members may include; forming a first conductive layer on the crystalline semiconductors and the light blocking members, and photo-etching the first conductive layer using a second mask.

The forming of a plurality of amorphous semiconductors, a data line having a switching input electrode, a switching output electrode, and a driving control electrode on the gate line, the driving voltage line and the driving output electrode includes; forming an amorphous semiconductive layer on the gate line, the driving voltage line, and the driving output electrode, forming a second conductive layer on the amorphous semiconductor layer, and photo-etching the amorphous semiconductor layer and the second conductive layer using a third mask.

The forming of the crystalline semiconductor layer may include forming an amorphous semiconductor layer on the substrate, and crystallizing the amorphous semiconductor layer through solid phase crystallization ("SPC").

The forming of the crystalline semiconductor layer may further include forming an impurity-doped amorphous semiconductor layer after forming the amorphous semiconductor layer, wherein in the crystallizing of the amorphous semiconductor layer, the amorphous semiconductor layer, and the impurity-doped amorphous semiconductor layer may be crystallized together.

In the forming of the crystalline semiconductor and the light blocking member, photo-etching may be performed with a photosensitive pattern having a first portion and a second portion, wherein the second portion has a thickness thinner than a thickness of the first portion.

In the forming of the amorphous semiconductor, the data line, the switching output electrode, and the driving control electrode, photo-etching may be performed with a photosensitive pattern having a first portion and a second portion, wherein the second portion has a thickness thinner than a thickness of the first portion.

The exemplary embodiment of a method according to the present invention may further include forming a color filter before forming the passivation layer.

BRIEF DESCRIPTION OF THE DRAWINGS

The present invention will become more apparent by describing exemplary embodiments thereof in more detail with reference to the accompanying drawings, in which:

FIG. 4 is a schematic view illustrating an arrangement of a plurality of pixels in an exemplary embodiment of an OLED display according to the present invention;

DETAILED DESCRIPTION OF THE INVENTION

Figure 1:
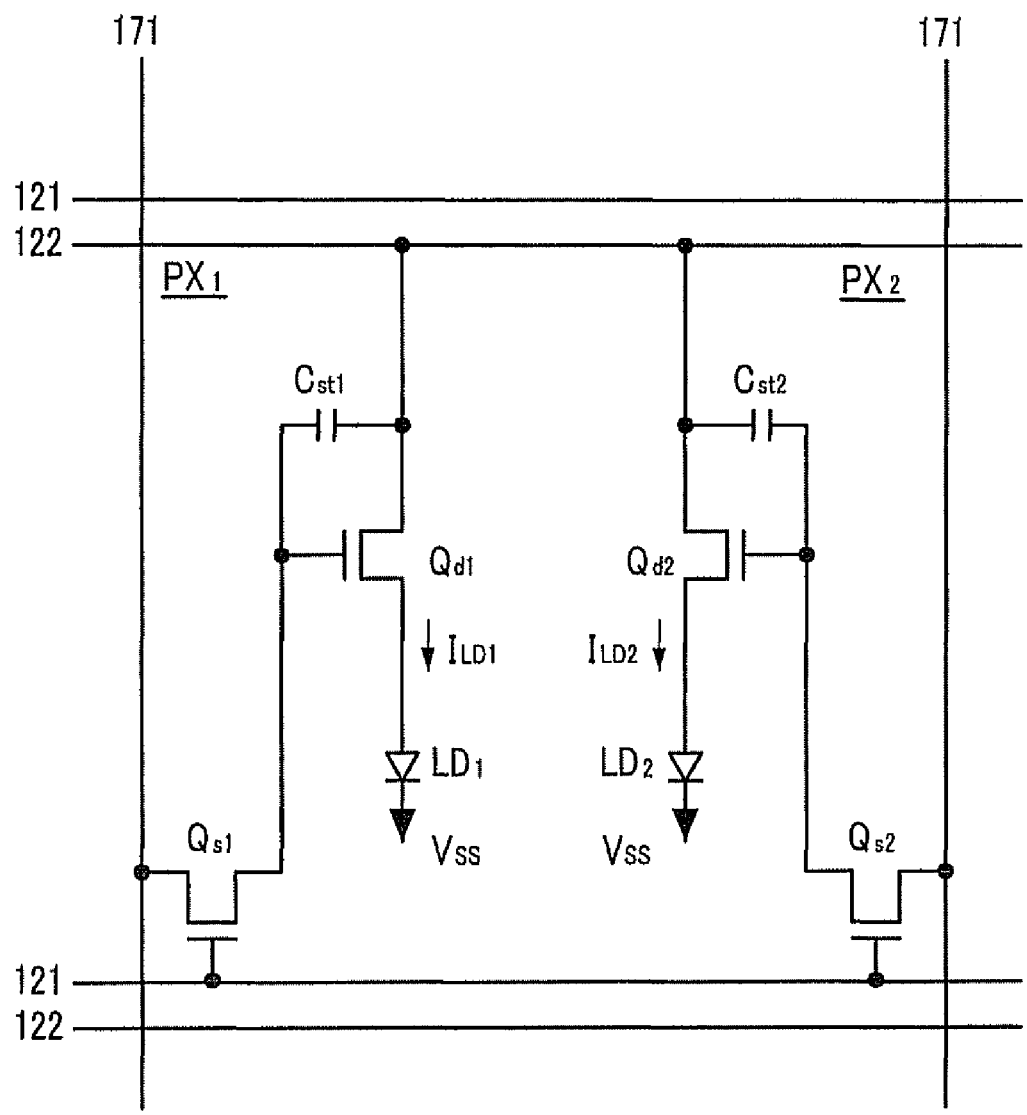
FIG. 1 is an equivalent circuit diagram of an exemplary embodiment of an organic light emitting diode ("OLED") display according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. Further, it will be understood that when a first element is referred to as being "on" a second element, the first element may be above or below the second element. As used herein, the term "and/or" includes any and all combinations of one or more of the associated listed items.

It will be understood that when an element is referred to as being "under" another element, it can be directly under the other element or intervening elements may be present therebetween. In contrast, when an element is referred to as being "directly under" another element, there are no intervening elements present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described more fully with reference to the accompanying drawings, in which preferred embodiments of the invention are shown. As those skilled in the art would realize, the described embodiments may be modified in various different ways, all without departing from the spirit or scope of the present invention.

First, an exemplary embodiment of an organic light emitting diode ("OLED") display according to the present invention will be described with reference to FIG. 1.

FIG. 1 is an equivalent circuit diagram of an exemplary embodiment of an OLED display according to the present invention.

Referring to FIG. 1, the present exemplary embodiment of an OLED display includes a plurality of signal lines 121, 171 and 122, and a plurality of pixels connected to the signal lines 121, 171 and 122 in which two pixels $PX_1$ and $PX_2$ are arranged in an approximate matrix form.

The signal lines includes a plurality of gate lines 121 which transfer gate signals (also called scan signals), a plurality of data lines 171 which transfer data signals, and a plurality of driving voltage lines 122 which transfer a driving voltage.

The gate lines 121 and the driving voltage lines 122 extend in substantially a row direction, and they are substantially parallel to one another. The data lines 171 extend in substantially a column direction, and they are substantially parallel to one another.

Two independent pixels $PX_1$ and $PX_2$ are disposed at a region defined by two adjacent gate lines 121 and two adjacent data lines 171.

Each of the pixels $PX_1$ and $PX_2$ includes a switching transistor $Q_{s1}$ or $Q_{s2}$, a driving transistor $Q_{d1}$ or $Q_{d2}$, a storage capacitor $C_{st1}$ or $C_{st2}$ and an OLED $LD_1$ or $LD_2$ respectively.

The switching transistor $Q_{s1}$ or $Q_{s2}$ includes a control terminal, an input terminal, and an output terminal. The control terminal is connected to the gate line 121, the input terminal is connected to the data line 171, and the output terminal is connected to the driving transistor $Q_{d1}$ or $Q_{d2}$ and one end of the storage capacitor $C_{st1}$ or $C_{st2}$ respectively. The switching transistor $Q_{s1}$ or $Q_{s2}$ transfers the data signal supplied from the data line 171 to the driving transistor $Q_{d1}$ or $Q_{d2}$ in response to a scan signal supplied to the gate line 121.

The driving transistor $Q_{d1}$ or $Q_{d2}$ also includes a control terminal, an input terminal, and an output terminal. The control terminal is connected to the switching transistor $Q_{s1}$ or $Q_{s2}$, the input terminal is connected to the driving voltage line 122 and one end of the storage capacitors $C_{st1}$ or $C_{st2}$ and the output terminal is connected to OLED $LD_1$, or $LD_2$, respectively. The driving transistor $Q_{d1}$ or $Q_{d2}$ flows output current $I_{LD1}$ and $I_{LD2}$, respectively, having an amplitude which varies according to the voltage formed between the control terminal and the output terminal.

The storage capacitor $C_{st1}$ or $C_{st2}$ is coupled between the control terminal and the input terminal in the driving transistor $Q_{d1}$ or $Q_{d2}$. The storage capacitor $C_{st1}$ or $C_{st2}$ charges the data signal supplied to the control terminal of the driving transistor $Q_{d1}$ or $Q_{d2}$ and sustains the charged data signal after turning off the switching transistor $Q_{s1}$ and $Q_{s2}$.

The OLED $LD_1$ or $LD_2$ include an anode connected to the output terminal of the driving transistor $Q_{d1}$ or $Q_{d2}$ and a cathode connected to a common voltage Vss. The OLED $LD_1$ or $LD_2$ displays images by emitting light with varying intensity according to the output current $I_{LD1}$ or $I_{LD2}$, respectively, of the driving transistor $Q_{d1}$ or $Q_{d2}$.

According to the present exemplary embodiment, the switching transistor $Q_{s1}$ or $Q_{s2}$ and the driving transistor $Q_{d1}$ or $Q_{d2}$ are n-channel field effect transistors ("FET"). However, alternative exemplary embodiments include configurations wherein at least one of the switching transistor $Q_{s1}$ or $Q_{s2}$ and the driving transistor $Q_{d1}$ or $Q_{d2}$ may be a p-channel FET. Also, the coupling relationship between the transistors $Q_{s1}$, $Q_{s2}$, $Q_{d1}$, and $Q_{d2}$, the storage capacitors $C_{st1}$ and $C_{st2}$ and the OLED $LD_1$ and $LD_2$ may be different.

Hereinafter, the structure of the OLED display shown in FIG. 1 will be described with reference to the accompanying drawings.

The detailed structure of the OLED display shown in FIG. 1 will be further described with reference to FIG. 2 and FIG. 3.

Figure 2:
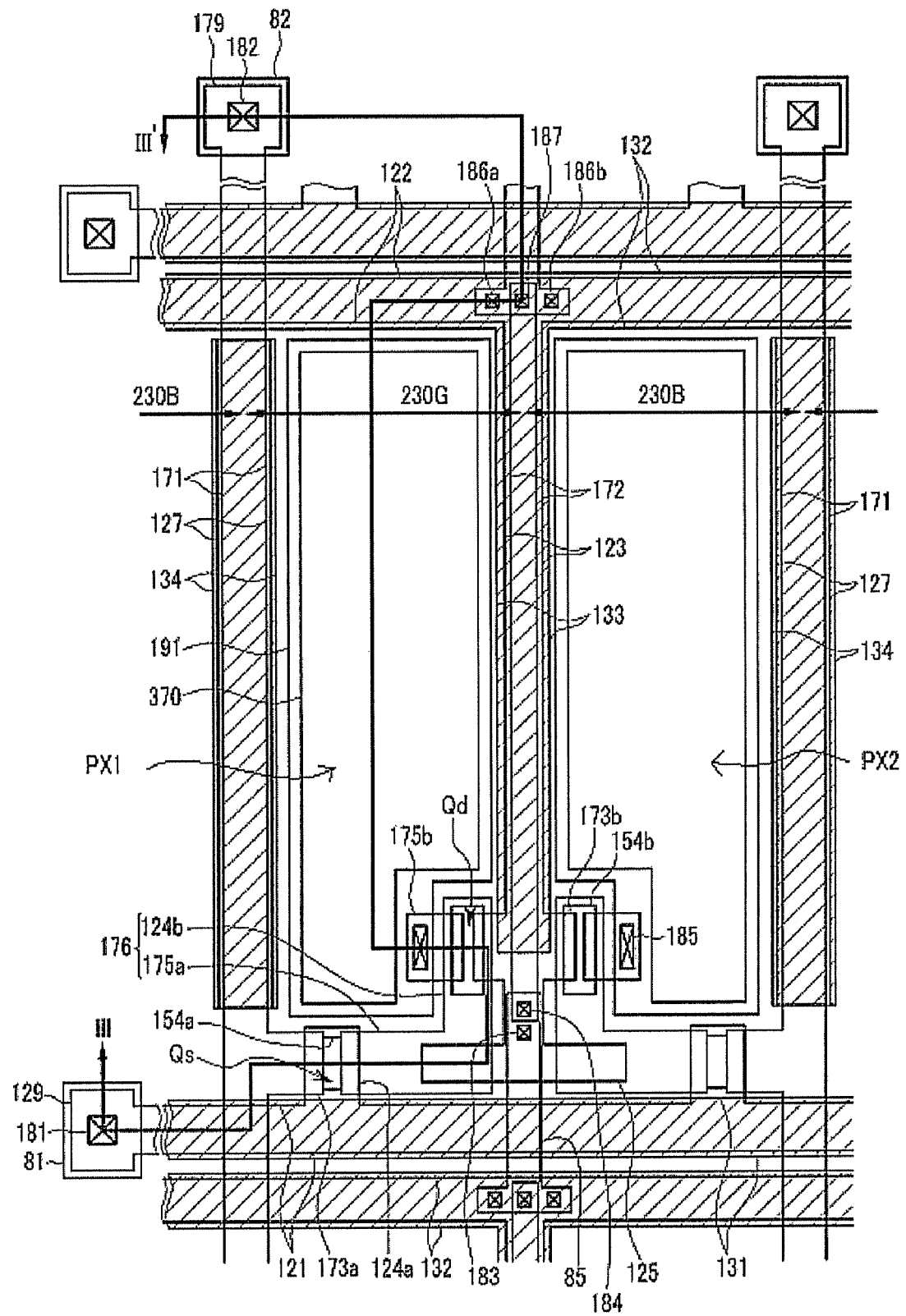
FIG. 2 is a top plan layout view of an exemplary embodiment of an OLED display.

FIG. 2 is a top plan layout view of an exemplary embodiment of an OLED display. FIG. 3 is a cross-sectional view of an exemplary embodiment of the OLED display of FIG. 2 taken along line III-III'.

FIG. 2 shows two pixels PX1 and PX2 disposed between two adjacent gate lines 121 and two adjacent data lines 171 in an exemplary embodiment of an OLED display according to the present invention.

Two pixels PX1 and PX2 are disposed symmetrically about an extension 123 of the driving voltage line 122 which is disposed between the two data lines 171. The same reference numerals are assigned to the same elements which are symmetrically arranged at each of the pixels PX1 and PX2, and some of the reference numerals for the same elements are omitted from the drawing for clarity.

A driving semiconductor 154b, exemplary embodiments of which may be made of microcrystalline or polycrystalline silicon, is formed on an insulating substrate 110, exemplary embodiments of which may be made of transparent glass or plastic, and a plurality of semiconductor members 151b, exemplary embodiments of which may be made of microcrystalline or polycrystalline silicon, are formed on the substrate 110 separated from the driving semiconductor 154b.

A plurality of light blocking members 131, 132, 133, and 134 are formed on the plurality of semiconductor members 151b, wherein the light blocking members 131, 132, 133, and 134 are made of an opaque conductive material, exemplary embodiments of which include Cr, an oxide of an opaque conductive material, such as $CrO_x$, or the opaque conductive material-the oxide of the opaque conductive material such as Cr—$CrO_x$. The light blocking members 131 and 132 extend substantially in a row direction, and the light blocking member 132 includes a light blocking member 133 that extends substantially in a column direction along the extension of the driving voltage line 123. The light blocking member 134 extends substantially in a column direction.

The light blocking members 131, 132, 133 and 134 have substantially the same planar shape as the semiconductor member 151b. The light blocking members 131, 132, 133 and 134 are not formed on the driving semiconductor 154b.

An impurity semiconductor member 161b, exemplary embodiments of which may be made of crystalline silicon with an n-type impurity highly doped therein, such as phosphorus (P), is formed between the semiconductor member 151b and the light blocking members 131, 132, 133, and 134.

A plurality of gate lines 121, a plurality of driving voltage lines 122, a plurality of driving output electrodes 175b and a plurality of assistant members 127 are formed on the driving semiconductor 154b and the light blocking members 134.

The gate lines 121 extend substantially in a horizontal direction and transfer a gate signal. Each of gate lines 121 includes switching control electrodes 124a which extend upwardly and end portions 129 having a wide area to be connected to another layer, or an external driving circuit. In an alternative exemplary embodiment the driving circuit (not shown) generating a gate signal may be integrated on the substrate 110; in such an exemplary embodiment the gate line 121 may be extended to be directly connected to a gate driving circuit.

The driving voltage line 122 transfers a driving voltage and basically extends in a horizontal direction to be parallel to the gate lines 121. The driving voltage line 122 includes the extension 123 which extends vertically between the two adjacent gate lines 121. The extension 123 includes driving input electrodes 173b which project substantially symmetrically to the right and the left and have a predetermined portion in contact with the driving semiconductor 154b of each of pixels PX1 and PX2. The extension 123 also includes a storage capacitive conductor 125 having a wide end portion.

The driving output electrode 175b is disposed to be separated from the gate line 121 and the driving voltage line 122. The driving input electrode 173b and the driving output electrode 175b oppose each other on the driving semiconductor 154b.

The assistant member 127 is separated from the gate line 121, the driving voltage line 122, and the driving output electrode 175b.

Exemplary embodiments of the gate line 121, the driving voltage line 122, the driving output electrode 175b, and the assistant member 127 may be made of an aluminum containing metal such as aluminum (Al) or an aluminum alloy, a silver containing metal such as Ag or a Ag alloy, a copper containing metal such as Cu or a Cu alloy, a molybdenum containing metal such as Mo or a Mo alloy, Cr, Ta, and Ti. Exemplary embodiments of the gate line 121, the driving voltage line 122, the driving output electrode 175b, and the assistant member 127 include alternative configurations wherein they may have a multi-layer structure including two conductive layers (not shown) having different physical characteristics.

Exemplary embodiments of the gate line 121, the driving voltage line 122, the driving output electrode 175b, and the assistant member 127 may be inclined with respect to the substrate 110. In one exemplary embodiment the inclination angle thereof may be about 30° to about 80°.

The light blocking members 131, 132, 133, and 134 are placed under the gate line 121, the driving voltage line 122, and the assistant member 127. The light blocking members 131, 132, 133, and 134 prevent external light which enters from the bottom of the substrate 110 from being reflected by the gate line 121, the driving voltage line 122, and the assistant member 127, which are made of an opaque metal such as aluminum. Therefore, the contrast ratio of the OLED display can be improved by preventing the reflection of the external light without the need to place a polarizer at the bottom of the substrate 110.

Ohmic contacts 163b and 165b, exemplary embodiments of which may be made of crystalline silicon with an n-type impurity highly doped therein, such as phosphorus (P), are formed between the driving input electrode 173b and the driving semiconductor 154b and between the driving output electrode 175b and the driving semiconductor 154b.

A gate insulating layer 140 made of silicon nitride ($SiN_x$) or silicon oxide ($SiO_x$) is formed on the gate line 121, the driving voltage line 122, the driving output electrode 175b, and the assistant member 127.

A plurality of linear semiconductors 151a and semiconductor members 156a, exemplary embodiments of which are made of hydrogenated amorphous silicon, are formed on the gate insulating layer 140.

The linear semiconductor 151a extends in a substantially vertical direction and includes a portion overlapping the assistant members 127 and a portion intersecting the gate line 121 and the driving voltage line 122. The linear semiconductor 151a includes a protrusion formed at the end thereof, which projects upwardly from the linear semiconductor 151a. The protrusion includes a switching semiconductor 154a overlapping the switching control electrode 124a.

The semiconductor member 156a is formed to overlap the extension 123 of the driving voltage line 122.

A plurality of data lines 171, a plurality of coupling electrodes 176, a plurality of switching input electrodes 173 and a plurality of driving voltage assistants 172 are formed on the linear semiconductor 151a, the semiconductor member 156a, and the gate insulating layer 140.

An ohmic contact 163a, exemplary embodiments of which may be made of crystalline silicon with an n-type impurity highly doped therein, such as phosphorus (P), is formed between the switching input electrode 173a and the linear semiconductor 151a and between the data line 171 and the linear semiconductor 151a.

The data lines 171 transfer a data signal and extend in a substantially vertical direction so as to cross the gate line 121 and the driving voltage line 122. Each of the data lines 171 are formed between the extensions 123 of the driving voltage lines 122.

Each of the data lines 171 includes a plurality of switching input electrodes 173a extending toward the switching control electrode 124a and a wide end portion 179 to be connected to another layer or an external driving circuit. A data driving circuit (not shown) generating a data signal may be placed on a flexible printed circuit (not shown) on the substrate 110, may be directly formed on the substrate 110, or may be integrated on the substrate 110. Alternative exemplary embodiments include the configuration wherein the data driving circuit 110 is integrated on the substrate 110 and the data driving circuit 110 may be connected to the extended data line 171.

The coupling electrode 176 is separated from the data line 171. The coupling electrode 176 includes a switching output electrode 175a facing the switching input electrode 173a on a switching control electrode 124a therebetween, and a driving control electrode 124b which overlaps the driving semiconductor 154b.

The coupling electrode 176 forms storage capacitors Cst1 and Cst2 by overlapping a portion of the storage capacitive conductor 125.

When seen from the top plan view, the data line 171 and the coupling electrode 176 have substantially the same shape as the linear semiconductor 151a except for a gap in an area between the switching input electrode 173a and the switching output electrode 175a.

The driving voltage assistant 172 is separated from the data line 171 and the coupling electrode 176, and overlaps the extension 123 of the driving voltage line 122. When seen from the top plan view, the driving voltage assistant 172 has substantially the same shape as the semiconductor member 156a.

Exemplary embodiments of the data line 171, the coupling electrode 176, and the driving voltage assistant 172 may be made of a conductive material substantially similar to that of the gate line 121.

In one exemplary embodiment the data line 171, the coupling electrode 176, and the driving voltage assistant 172 may be inclined to the substrate 110 at about 30° to about 80°.

An ohmic contact 161a is formed between the data line 171 and the linear semiconductor 151a and between the coupling electrode 176 and the linear semiconductor 151a. Also, an impurity semiconductor member 166a is formed between the driving voltage assistant 172 and the semiconductor member 156a. Exemplary embodiments of the ohmic contact 161a and the impurity semiconductor member 166a may be made of n+ hydrogenated amorphous silicon which is highly doped with an n-type impurity such as phosphorus (P), or they may be made of silicide.

Color filters 230B and 230G, the boundaries of which are illustrated by arrows in FIG. 2, are formed on the data line 171, the coupling electrode 176, and the driving voltage assistant 172. The color filters 230B and 230G are not formed on the end portion 129 of the gate line 121 and the end portion 179 of the data line 171 which are connected to an external circuit, the edges of the color filters 230B and 230G overlap on the data line 171, the gate line 121, or the extension 123 of the driving voltage line 122. As described above, by forming the edges of the color filters 230B and 230G to overlap, light may be blocked from leaking from between the pixels.

Figure 3:
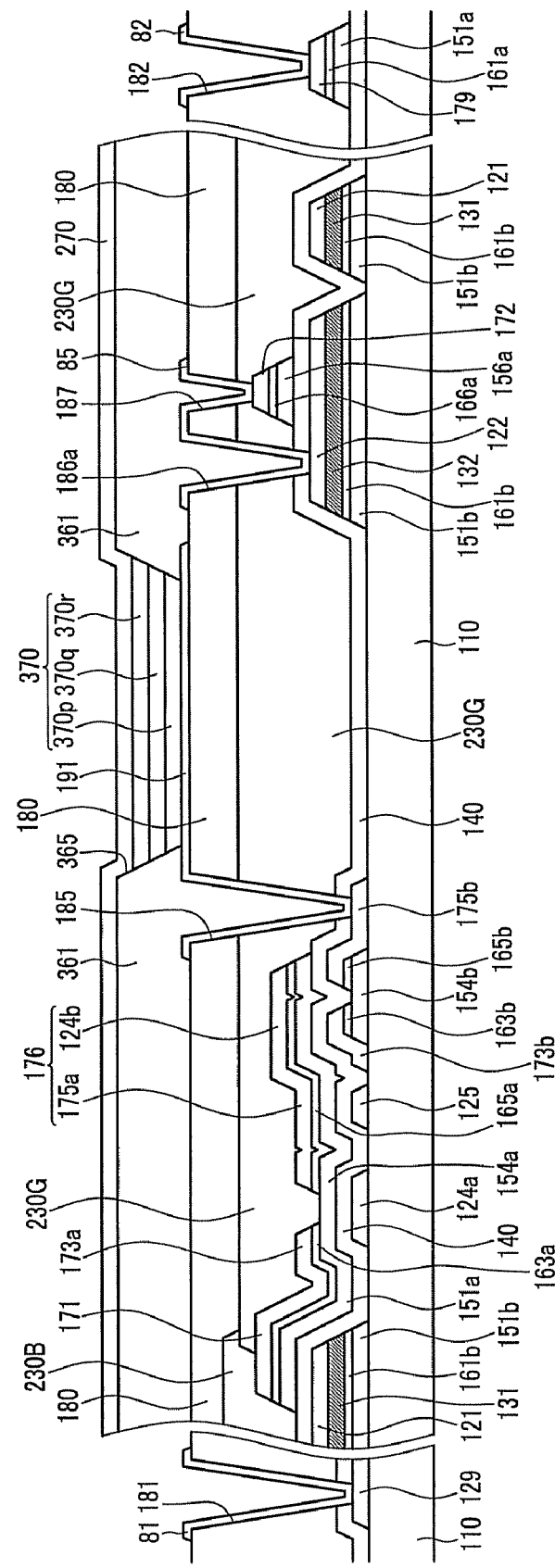
FIG. 3 is a cross-sectional view of an exemplary embodiment of the OLED display of FIG. 2 taken along line III-III'.

FIG. 2 and FIG. 3 show a green color filter 230G and a blue color filter 230B because only two pixels PX1 and PX2 are described therein. Basic color filters may be alternatively disposed as is well known in the art, and a white pixel may be interposed between those color filters, wherein the white pixel is a pixel with no color filter formed thereon.

The color filters 230B, 230G and 230R will be described in more detail with reference to FIG. 4.

FIG. 4 is a schematic view illustrating an arrangement of a plurality of pixels in an exemplary embodiment of an OLED display according to the present invention.

Referring to FIG. 4, a red pixel (R) for displaying a red color, a green pixel (G) for displaying a green color, a blue pixel (B) for displaying a blue color, and a white pixel (W) for not displaying any color are alternatively disposed in an exemplary embodiment of an OLED display according to the present invention. Red pixels (R) are created by placing a red color filter over a pixel. Therefore, the exemplary embodiment of a pair of pixels PX1 and PX2 shown in FIG. 2 contains a green pixel and a blue pixel, respectively. In the present exemplary embodiment a pixel group is formed of four pixels including a red pixel (R), a green pixel (G), a blue pixel (B), and a white pixel (W), and such a pixel group is repeatedly formed along a column and/or a row. Alternative exemplary embodiments include configurations wherein the arrangement of pixels may vary.

The red pixel (R), the green pixel (G) and the blue pixel (B) include a red filter, a green filter and a blue filter, respectively. The white pixel (W) does not include a color filter or it may include a transparent white filter.

The two pixels PX1 and PX2 shown in FIG. 2 and FIG. 3 may be represented by the region surrounded by the dotted line in FIG. 4.

Referring again to FIGS. 2 and 3, an interlayer insulating layer (not shown) may be formed under the color filters 230G and 230B. The interlayer insulating layer prevents the pigments of the color filter from flowing to the switching semiconductor 154a.

A passivation layer 180 is formed on the color filters 230G and 230B. Exemplary embodiments of the passivation layer 180 may be made of an inorganic insulator such as $SiN_x$ or $SiO_2$, an organic insulator, or a low dielectric constant insulator.

A plurality of contact holes 182 are formed in the passivation layer 180 which expose the end portion 179 of the data line 171, and a contact hole 181 is formed in the passivation layer 180 and the gate insulating layer 140 to expose the end portion 129 of the gate line 121. Also, contact holes 184 and 187 are formed in the passivation layer 180 and the color filter 230G which expose a driving voltage assistant 172, and a plurality of contact holes 183, 185, 186a, and 186b are formed in the passivation layer 180, the color filter 230G, and the gate insulating layer 140 which expose the driving output electrode 175b and the driving voltage line 122.

A plurality of pixel electrodes 191, a plurality of overpasses 85, and a plurality of contact assistants 81 and 82 are formed on the passivation layer 180.

A pixel electrode 191 is electrically connected to the driving output electrode 175b.

The overpass 85 is connected to the driving voltage line 122 and the driving voltage assistant 172 through the contact holes 183, 184, 186a, 186b, and 187. Also, the overpass 85 is simultaneously connected to the driving voltage line 122 and the driving voltage assistant 172 of an adjacent pixel.

The contact assistants 81 and 82 are connected to the end portion 129 of the gate line 121 and the end portion 179 of the data line 171 through the contact holes 181 and 182, respectively. The contact assistants 81 and 82 improve the adhesive properties of the end portions 129 and 179 of the gate line 121 and the data line 171, and protects them.

Exemplary embodiments of the pixel electrode 191, the overpass 85, and the contact assistants 81 and 82 may be made of a transparent conductive material such as ITO or IZO. In the case of a top emission type display, wherein light from the OLED is emitted to an outside in a direction away from the substrate 110, exemplary embodiments of the pixel electrode 191, the overpass 85, and the contact assistants 81 and 82 may be made of aluminum, an aluminum alloy, or an opaque conductor having a high work function such as Au, Pt, Ni, Cu, W, or compositions thereof. However, in a bottom emission type display, as in the present exemplary embodiment, the pixel electrode 191, the overpass 85, and the contact assistants 81 and 82 must be transparent in order to allow light generated by the OLED to pass therethrough on its way through the substrate 110 to an outside.

An insulating bank 361 is formed on the pixel electrode 191, the overpass 85, and the contact assistants 81 and 82. The insulating bank 361 has an opening 365 which is formed on the pixel electrode 191 and defined by the insulating bank 361. The insulating bank 361 serves as a partition. The insulating bank 361 may be made of an organic insulator having a thermal resistance and solvent resistance exemplary embodiments of which include acrylic resin and polyimide resin, or an inorganic insulator exemplary embodiments of which include silicon dioxide ($SiO_2$) and titanium dioxide ($TiO_2$). Alternative exemplary embodiments include configurations wherein the insulating bank 361 may be formed as more than two layers. Exemplary embodiments of the insulating bank 361 may be made of a photosensitive material having a black pigment. In such an exemplary embodiment, the insulating bank 361 functions as a light blocking member, and its manufacturing process is simple.

An organic light emitting member is formed in the opening 365.

The organic light emitting member includes an emitting layer 370 for emitting light, and an auxiliary layer (not shown) formed on the bottom and/or the top of the emitting layer 370 for improving the light emitting efficiency. Exemplary embodiments of the auxiliary layer include hole injecting layers (not shown), electron injecting layers (not shown), hole transport layers (not shown) and electron transport layers (not shown).

The emitting layer 370 may emit white light. The white light may be emitted by mixing light emitted from the sub-emitting layers 370p, 370q and 370r through sequentially stacking materials emitting red, green, and blue light. Alternative exemplary embodiments of the present invention include configurations wherein the sub emitting layers are horizontally formed therein. Also, the combination of light to emit the white light is not limited to red, green, and blue color light. The sub-emitting layers may be formed with various color combinations which emit white light.

Exemplary embodiments of the emitting layer 370 may be made of a high molecular weight compound such as a polyfluorene derivative, a (poly)paraphenylenevinylene derivative, a polyphenylene derivative, a polyvinylcarbazole derivative, and a polythiophene derivative, or a low molecular weight compound such as anthracene, one exemplary embodiment of which is 9,10-diphenylanthracene, a butadiene such as tetraphenylbutadiene, a tetracene derivative, a distyrylarylene derivative, a benzazole derivative, or a carbazole derivative. Also, exemplary embodiments of the emitting layer 370 may be formed of an exemplary embodiment of a high molecular weight compound or an exemplary embodiment of a low molecular weight compound as a host material and the host material may then be doped with a dopant. Exemplary embodiments of the dopant include xanthene, perylene, cumarine, rhodamine, rubrene, dicyanomethylenepyran compound, thiopyran compound, (thia)pyrilium compound, a periflanthene derivative, an indenoperylene derivative, a carbostyryl compound, Nile red, and quinacridone. The dopant may be used to improve light emitting efficiency.

The white light emitted from the emitting layer 370 may then be passed through a color filter 230G, 230B, or 230R (not shown) to emit a desired color. As described above, the overall luminance of the display can be improved by further including the white pixel (W) as well as the red, green and blue pixels (R, G, B).

Although an exemplary embodiment of a bottom emission type display where the color filters 230G and 230B are disposed under the emitting layer 370 was described in the present exemplary embodiment, the present invention may be identically applied to a top emission type display where the color filters 230G and 230B are disposed on the emitting layer 370.

As mentioned above, an electron transport layer (not shown) and a hole transport layer (not shown) for balancing electrons and holes, and an electron injecting layer (not shown) and a hole injecting layer (not shown) for enhancing the injection of the electrons and holes, may be used as the auxiliary layer. The auxiliary layer may be formed to include one or more additional layers. The hole transport layer and the hole injecting layer may be made of a material having a highest occupied molecular orbital ("HOMO") level between a work function of the pixel electrode 191 and a HOMO level of the emitting layer 370. The electron transport layer and the electron injecting layer may be made of a material having a lowest unoccupied molecular orbital ("LUMO") level between a work function of the common electrode 270 and a LUMO level of the emitting layer 370. Exemplary embodiments of the hole transport layer or the hole injecting layer may be made of a diamine compound, [4,4',4"-tris(3-methylphenyl)phenylamino]triphenylamine ("MTDATA"), N,N'-diphenyl-N,N'-di(3-methylphenyl)-1,1'-biphenyl-4,4'-diamine ("TPD"), 1,1-bis(4-di-p-tolylaminophenyl)cyclohexane), N,N,N',N'-tetra(2-naphthyl)-4,4-diamino-p-terphenyl, 4,4',4-tris[(3-methylphenyl)phenylamino]triphenylamine), polypyrrole, polyaniline, or poly-(3,4-ethylenedioxythiophene:polystyrenesulfonate) ("PEDOT: PSS").

A common electrode 270 is formed on the organic light emitting member and the insulating bank 361. The common electrode 270 is formed across substantially the entire substrate, and forms a pair with the pixel electrode 191 to allow current to flow through the emitting layer 370.

Referring to FIGS. 1-3, the switching control electrode 124a connected to the gate line 121, the switching input electrode 173a connected to the data line 171, and the switching output electrode 175a form a switching TFT (Qs) with the switching semiconductor 154a. The channel of the switching TFT (Qs) is formed at the switching semiconductor 154a between the switching input electrode 173a and the switching output electrode 175a.

The driving control electrode 124b which is connected to the switching output electrode 175a, the driving input electrode 173b which is connected to the driving voltage line 122 through the extension of the data voltage line 123, and the driving output electrode 175b which is connected to the pixel electrode 191 through the contact hole 185, form a driving TFT (Qd) with a driving semiconductor 154b. The channel of the driving TFT Qd is formed at the driving semiconductor 154b between the driving input electrode 173b and the driving output electrode 175b.

As described above, exemplary embodiments of the switching semiconductor 154a may be made of an amorphous semiconductor, and the driving semiconductor 154b may be made of a microcrystalline or polycrystalline semiconductor. That is, the channel of the exemplary embodiment of a switching TFT is formed in an amorphous semiconductor, and the channel of the exemplary embodiment of a driving TFT is formed in a microcrystalline or polycrystalline semiconductor.

In the present exemplary embodiment, the channels of the switching TFT and the driving TFT are formed in a semiconductor with different crystallinity. Accordingly, the characteristics required by each of TFTs can be satisfied.

By forming the channel of the driving TFT in the polycrystalline semiconductor, high carrier mobility and stability can be obtained. Accordingly, the amount of current flowing to an organic light emitting device increases, and thus the luminance thereof can be improved. Also, by forming the channel of the driving TFT in the microcrystalline or polycrystalline semiconductor, a threshold voltage (Vth) shift, can be prevented so as to prevent the image sticking problem and to prevent the lifetime from being shortened. A threshold voltage (Vth) shift refers to a problematic increase in the amount of voltage necessary to be applied to the driving transistor in order for that transistor to turn on. The threshold voltage (Vth) shift arises when a positive voltage is continuously applied while driving the OLED display. An exemplary embodiment of an OLED display according to the present invention is able to drive the OLED with a substantially constant voltage, thereby avoiding the problems associated with ever increasing turn on voltages, such as excess heat, which may cause damage to TFTs or OLEDs and reduce the lifetime of the display.

Meanwhile, the on/off characteristics of the switching TFT are very important because the switching TFT controls data voltage. In particular, it is very important to reduce the off-current. However, microcrystalline or polycrystalline semiconductors have a large off-current, the data voltage which passes through a switching TFT made of such material may be reduced and cross talk may occur between switching TFTs on the same line. Therefore, according to an exemplary embodiment of the present invention, the switching TFT is made of an amorphous semiconductor having a small off-current so that the data voltage is prevented from being reduced and cross talk is reduced or effectively prevented.

As described above, the exemplary embodiment of an OLED display according to the present invention is described to have only one switching TFT and one driving TFT. However, the OLED display according to the present invention may further include at least one TFT and a plurality of lines for driving the TFT for compensating and preventing the organic light emitting diode (OLED) and the driving TFT (Qd) from being degraded even if the OLED display is driven for a long time so as to prevent the lifetime of the OLED display from being shortened.

The pixel electrode 191, the emitting layer 370, and the common electrode 270 form an OLED. The pixel electrode 191 functions as an anode and the common electrode 270 functions as a cathode. Alternative exemplary embodiments include configurations wherein, the pixel electrode 191 may function a cathode and the common electrode 270 may function as an anode. Also, the coupling electrode 176 and the extension 123 of the driving voltage line 122, which overlap one another, form a storage capacitor Cst.

Hereinafter, an exemplary embodiment of a method of manufacturing an exemplary embodiment of the OLED display shown in FIG. 2 and FIG. 3 will be described with reference to FIG. 5 through FIG. 19.

Figure 5A:
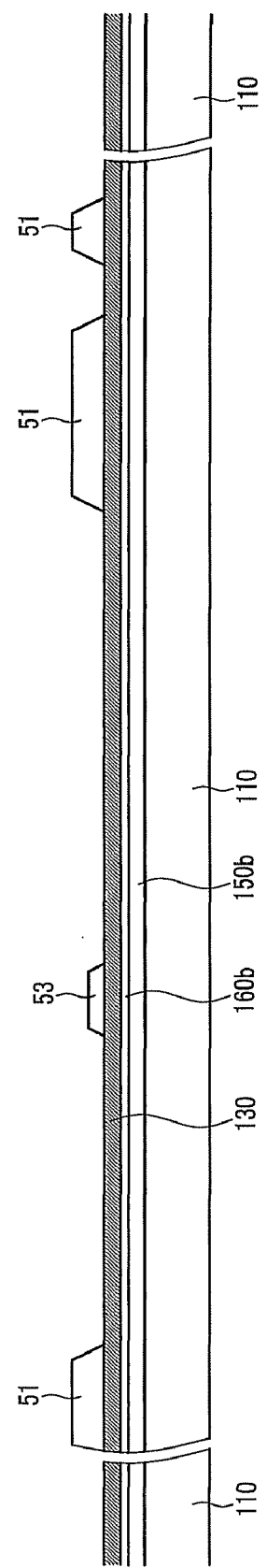
FIG. 5A and FIG. 5B are cross-sectional views illustrating an exemplary embodiment of a method for manufacturing an exemplary embodiment of an OLED display according to the present invention.
Figure 5B:
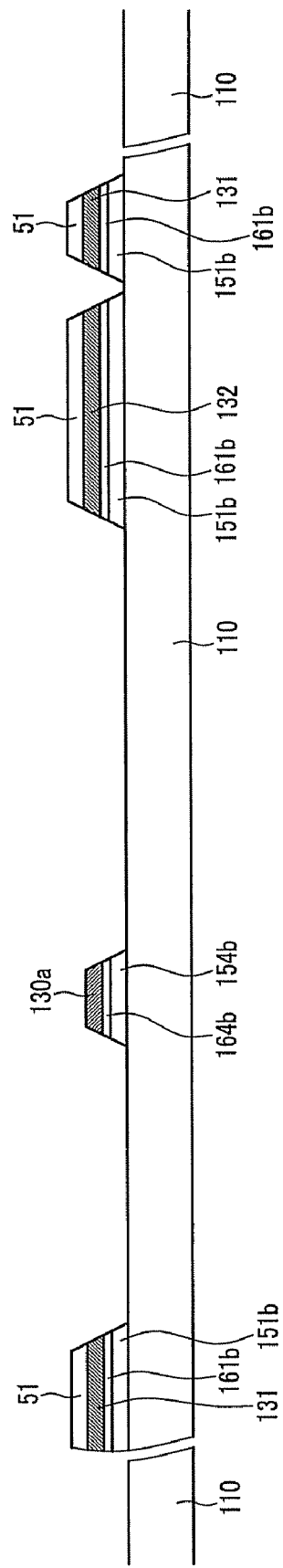
Figure 7:
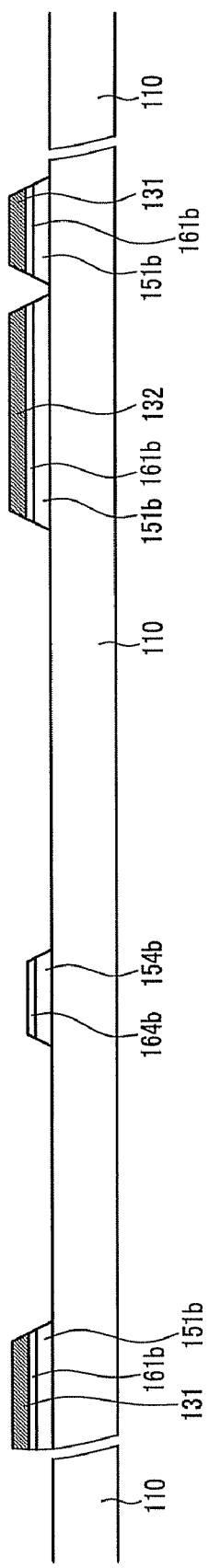
FIG. 7 is a cross-sectional view of the exemplary embodiment of an OLED display shown in FIG. 6 taken along line VII-VII'.
Figure 8:
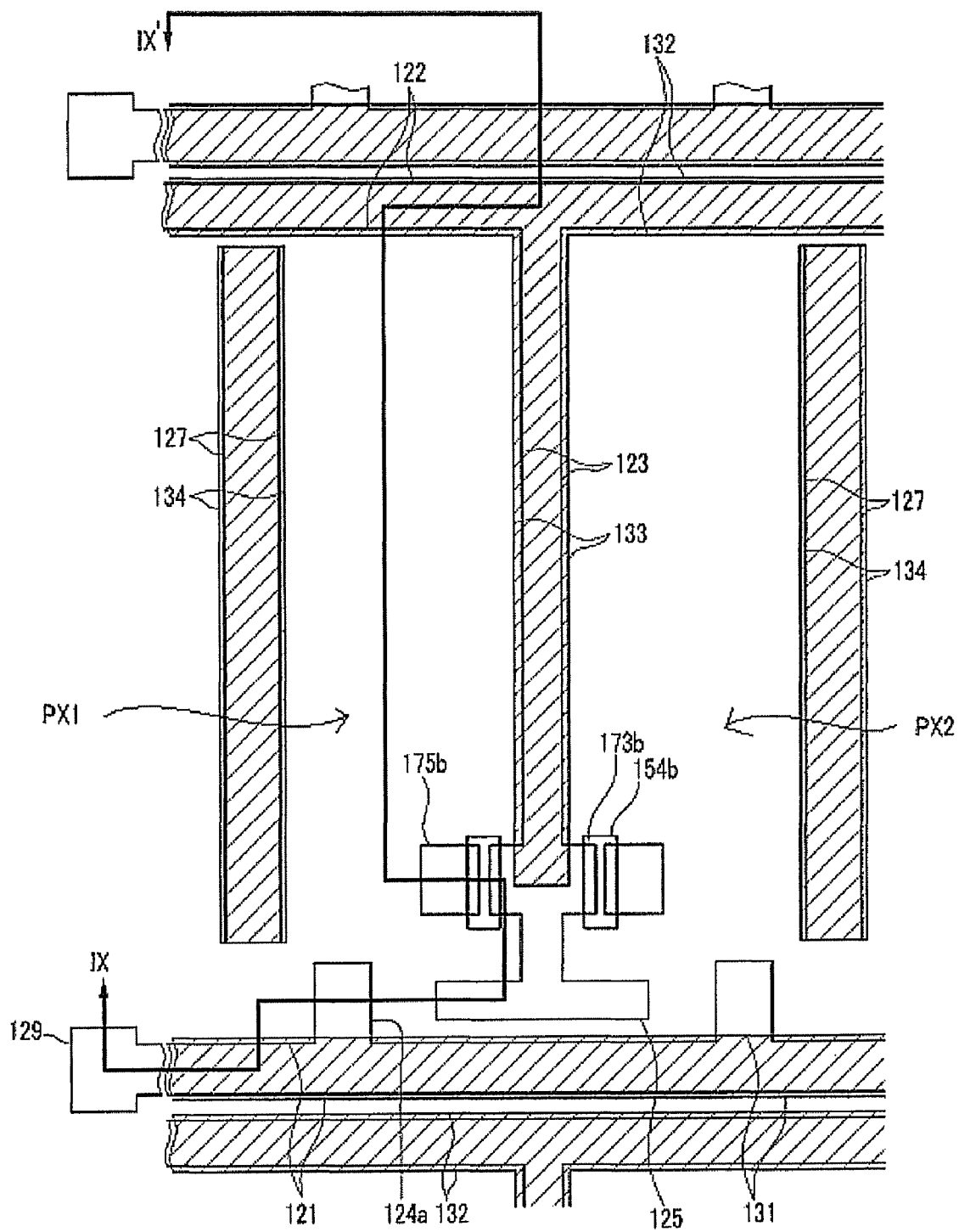
FIG. 8 is a top plan layout view of a step in a method for manufacturing an exemplary embodiment of an OLED display according to the present invention.
Figure 9:
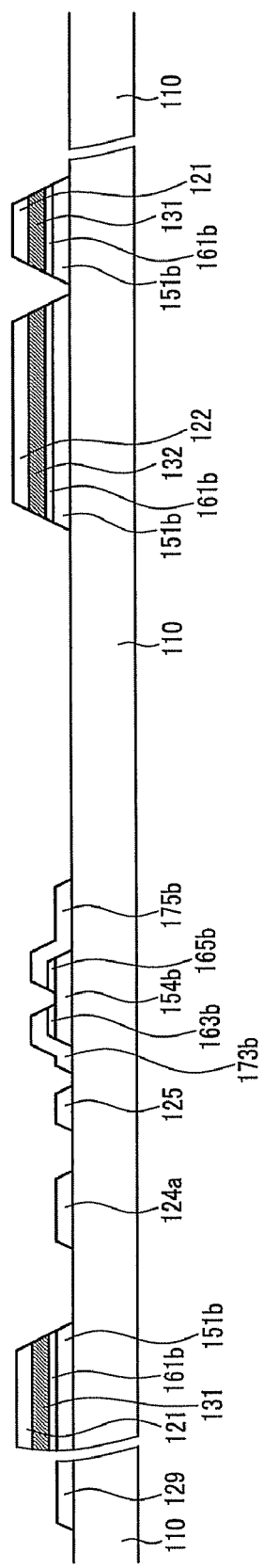
FIG. 9 is a cross-sectional view of the exemplary embodiment of an OLED display shown in FIG. 8 taken along line IX-IX'.
Figure 10:
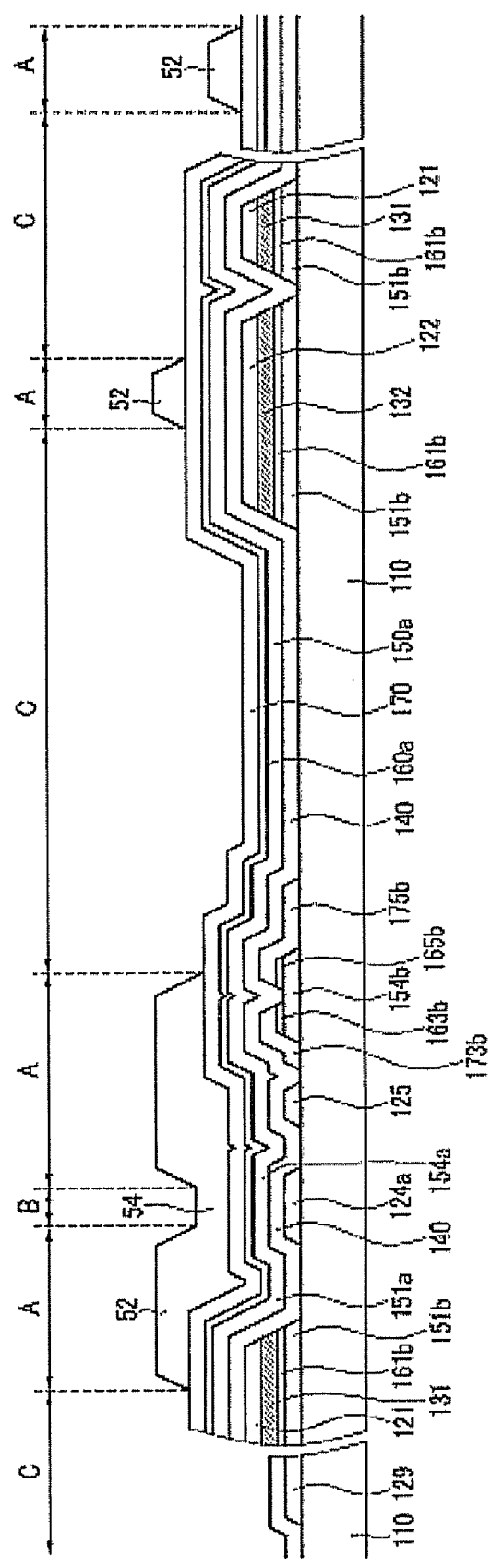
FIG. 10 and FIG. 11 are cross-sectional views illustrating exemplary embodiments of consecutive manufacturing processes of the exemplary embodiment of an OLED display shown in FIG. 8 and FIG. 9.
Figure 11:
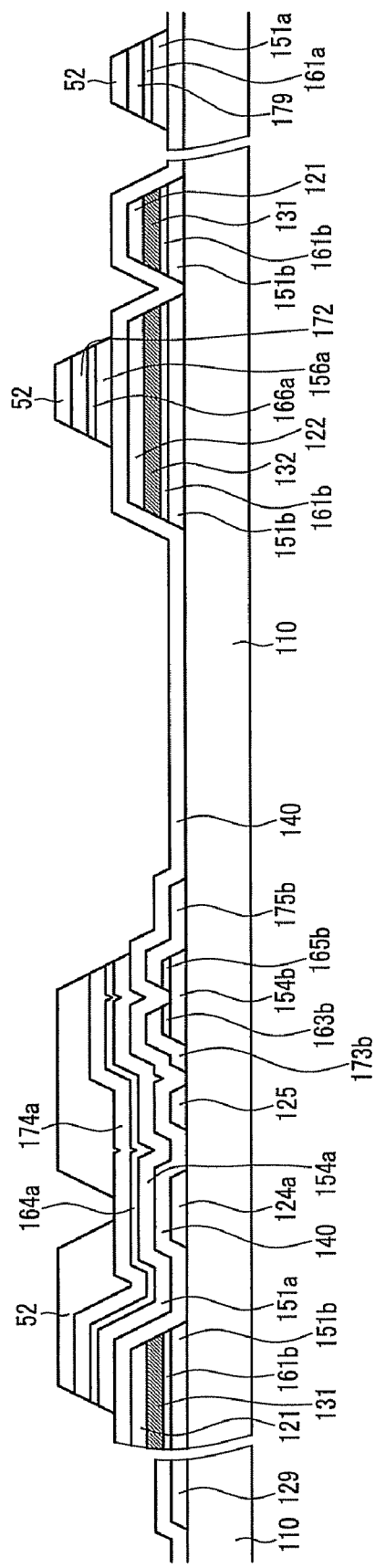

FIGS. 6, FIG. 8, FIG. 12, FIG. 14, FIG. 16 and FIG. 18 are top plan layout views of a method for manufacturing an exemplary embodiment of an OLED display according to the present invention. FIG. 5A and FIG. 5B are cross-sectional views illustrating an exemplary embodiment of a method for manufacturing an exemplary embodiment of an OLED display according to the present invention, FIG. 7 is a cross-sectional view of the exemplary embodiment of an OLED display shown in FIG. 6 taken along line VII-VII', and FIG. 9 is a cross-sectional view of the exemplary embodiment of an OLED display shown in FIG. 8 taken along line IX-IX'. FIG. 10 and FIG. 11 are cross-sectional views illustrating exemplary embodiments of consecutive manufacturing processes of the exemplary embodiment of an OLED display shown in FIG. 8 and FIG. 9, FIG. 13 is a cross-sectional view of the exemplary embodiment of an OLED display shown in FIG. 12 taken along line XIII-XIII', and FIG. 15 is a cross-sectional view of the exemplary embodiment of an OLED display shown in FIG. 14 taken along line XV-XV'. FIG. 17 is a cross-sectional view of the exemplary embodiment of an OLED display shown in FIG. 16 taken along line XVII-XVII', and FIG. 19 is a cross-sectional view of the exemplary embodiment of an OLED display shown in FIG. 18 taken along line XIX-XIX'.

An amorphous silicon layer and an impurity-doped amorphous silicon layer are sequentially deposited on an insulating substrate 110, and as shown in FIG. 5A, a polycrystalline silicon layer 150*b* and an impurity-doped polycrystalline silicon layer 160*b* are formed by crystallizing the amorphous silicon layer and the impurity-doped amorphous silicon layer. Exemplary embodiments of the crystallization may be performed through solid phase crystallization ("SPC"), rapid thermal annealing ("RTA"), liquid phase recrystallization ("LPR"), excimer laser annealing ("ELA"), or other various crystallization techniques. In the present exemplary embodiment the SPC technique is used.

Then, a light blocking layer 130, exemplary embodiments of which may be made of chromium oxide, is formed on the impurity-doped polycrystalline silicon layer 160*b*.

Then, a photosensitive layer is coated on the light blocking layer 130, and a first photosensitive pattern 51 and a second photosensitive pattern 53 which is thinner than the first photosensitive pattern 51 are formed by exposing and developing the photosensitive layer. The ratio of thicknesses of the first photosensitive pattern 51 and the second photosensitive pattern 53 may change according to the conditions of an etching process. However, in one exemplary embodiment the thickness of the second photosensitive pattern 53 is less than half as thick as the first photosensitive pattern 51.

As described above, many methods were introduced for forming photosensitive patterns 51 and 53 with thicknesses which differ according to location on the display. Exemplary embodiments of the formation method include an exposure mask having a transparent area, a light blocking area, and a semi-transparent area. In the semi-transparent area, a slit pattern, a lattice pattern, or a thin film with intermediate permittivity or a half thickness are disposed. Exemplary embodiments of the slit pattern have a structure in which the width of the slit and the distance between the slits may be smaller than the resolution of an exposure apparatus.

As shown in FIG. 5B, impurity-doped polycrystalline silicon patterns 161*b* and 164*b*, a semiconductor member 151*b*, and a driving semiconductor 154*b* are formed to have a shape, when seen from a top plan view, which is substantially identical to a plurality of light blocking members 130*a*, 131, 132, 133, and 134, by etching the impurity-doped polycrystalline silicon layer 160*b* and polycrystalline silicon layer 150*b* using the first and second photosensitive patterns 51 and 53 as masks.

Then, the second photosensitive pattern 53 is removed, exemplary embodiments of the removal process include an etch back process. Herein, a layer is removed from the first photosensitive pattern 51 of equal thickness to that of the second photosensitive pattern 53 before the etch back process.

Figure 6:
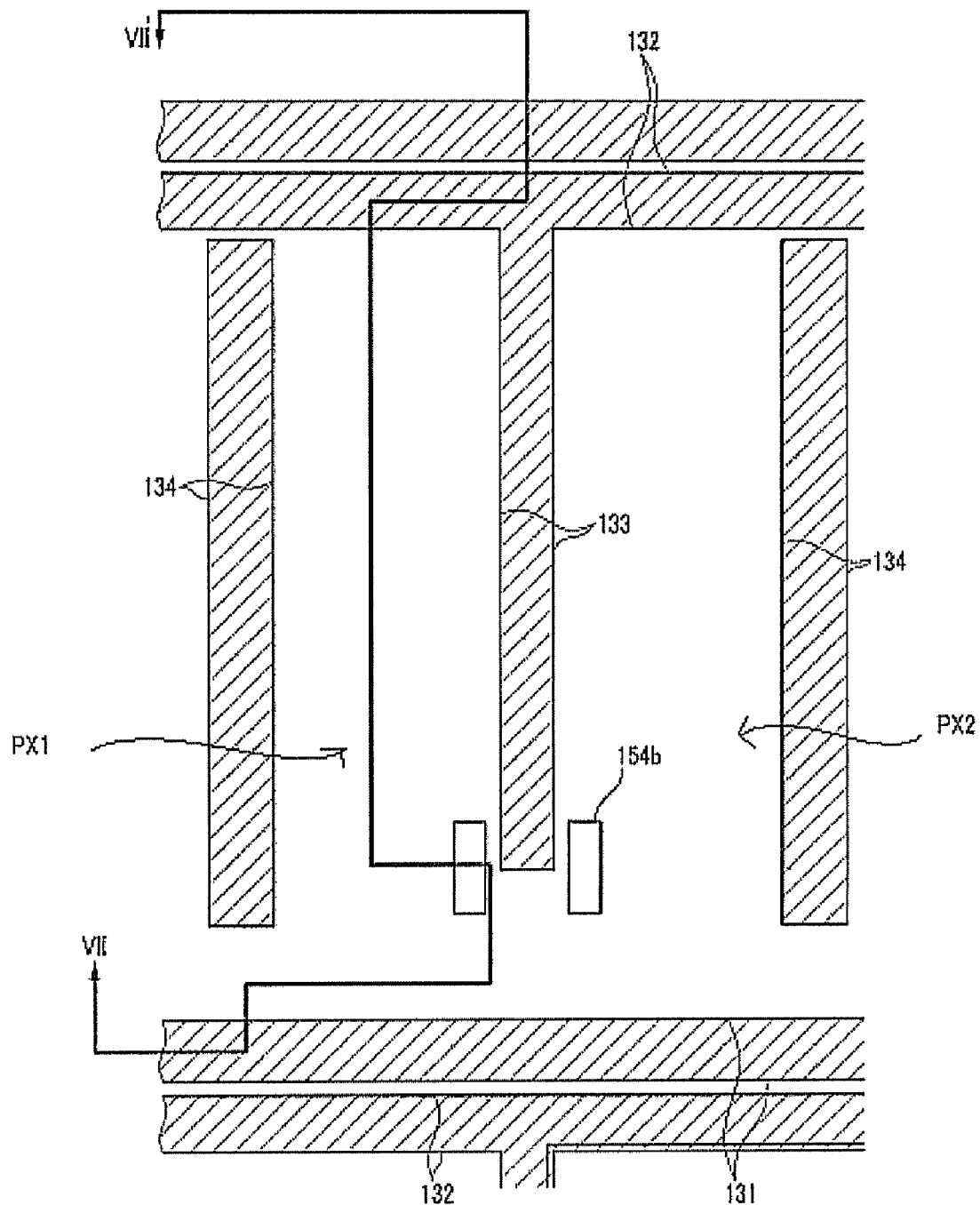
FIG. 6 is a top plan layout view of a step in a method for manufacturing an exemplary embodiment of an OLED display according to the present invention.

As shown in FIG. 6 and FIG. 7, the light blocking member 130*a*, which was left exposed by the etch back process, is removed using the remaining first photosensitive pattern 51 as a mask. As a result, the impurity-doped polycrystalline silicon pattern 164*b* is exposed.

Next, the driving semiconductor 154*b*, the plurality of semiconductor members 151*b*, the impurity-doped polycrystalline silicon patterns 161*b* and 164*b*, and a plurality of light blocking members 131, 132, 133, and 134 are formed by removing the remaining first photosensitive pattern 51 which was not removed by the etch back process.

As shown in FIG. 8 and FIG. 9, a conductive layer is deposited on the light blocking members 131, 132, 133, and 134, the polycrystalline silicon pattern 164b and on the substrate 110. Then, a gate line 121, a driving voltage line 122, an assistant member 127, and a driving output electrode 175b are formed by photo-etching the conductive layer. The gate line 121 includes a plurality of switching control electrodes 124a and the end portion 129 thereof, and the driving voltage line 122 includes the extension 123 having a plurality of driving input electrodes 173b and storage capacitive conductors 125.

Herein, a pair of ohmic contacts 163b and 165b are formed by dry-etching the impurity-doped polycrystalline silicon pattern 164b using the driving input electrode 173b and the driving output electrode 175b as a mask.

As shown in FIG. 10, a gate insulating layer 140, an amorphous silicon layer 150a, and an impurity-doped amorphous silicon layer 160a are formed on the gate line 121, the driving voltage line 122, the assistant 127, the driving output electrode 175b, and the substrate 110. One exemplary embodiment of the formation method is plasma enhanced chemical vapor deposition ("PECVD").

Afterward, a conductive layer 170 is formed on the impurity-doped amorphous silicon layer 160a. According to one exemplary embodiment the conductive layer 170 may be formed through sputtering.

Then, a photosensitive layer is coated on the conductive layer 170, and the first photosensitive pattern 52 and the second photosensitive pattern 54, which is thinner than the first photosensitive pattern 52, are formed by exposing and developing the photosensitive layer.

Herein, wire region A denotes portions of the conductive layer 170, the impurity-doped amorphous silicon layers 160a, and the amorphous silicon layer 150a, where a signal line is formed. Also, channel region B denotes a predetermined region on the switching control electrode 124a where a channel is formed. Region C denotes the regions remaining outside of the wire region A and the channel region B.

As previously stated, the first photosensitive pattern 52 formed at the wire region A is formed to be thicker than the second photosensitive pattern 54 formed at the channel region B. The photosensitive layer formed on the remaining region C is removed. Herein, the thickness ratio of the first and second photosensitive patterns 52 and 54 are controlled according to the conditions of a later etching process. In one exemplary embodiment the thickness of the second photosensitive pattern 54 may be thinner than half of the thickness of the first photosensitive pattern 52.

As shown in FIG. 11, the conductive layer 170, which was left exposed in the region C, is removed using the first and second photosensitive patterns 52 and 54 as a mask to form a plurality of conductive patterns 171, 172, 174a, 176 and 179. According to one exemplary embodiment of the present invention the conductive layer 170 is removed using a wet etching process.

Then, impurity-doped amorphous silicon patterns 161a, 164a and 166a and amorphous silicon patterns 151a and 156a are formed by dry-etching the impurity-doped amorphous silicon layer 160a and the amorphous silicon layer 150a, which remain at the remained region C, using the conductive patterns 171, 172, 174a, 176 and 179 as masks.

Afterward, the second photosensitive pattern 54 which remains at the channel region B is removed. One exemplary embodiment of the removal process is an etch back process.

Herein, the thickness of the first photosensitive pattern 52 is decreased by at least as much as the thickness of the removed photosensitive pattern 54.

Then, a data line 171 including a switching input electrode 173a, an end portion 179, a coupling electrode 176 including a switching output electrode 175a and a driving control electrode 124b, and a driving voltage assistant 172 are formed by etching the conductive patterns 171, 172, 174a, 176 and 179 using the first photosensitive pattern 52 as a mask.

Figure 12:
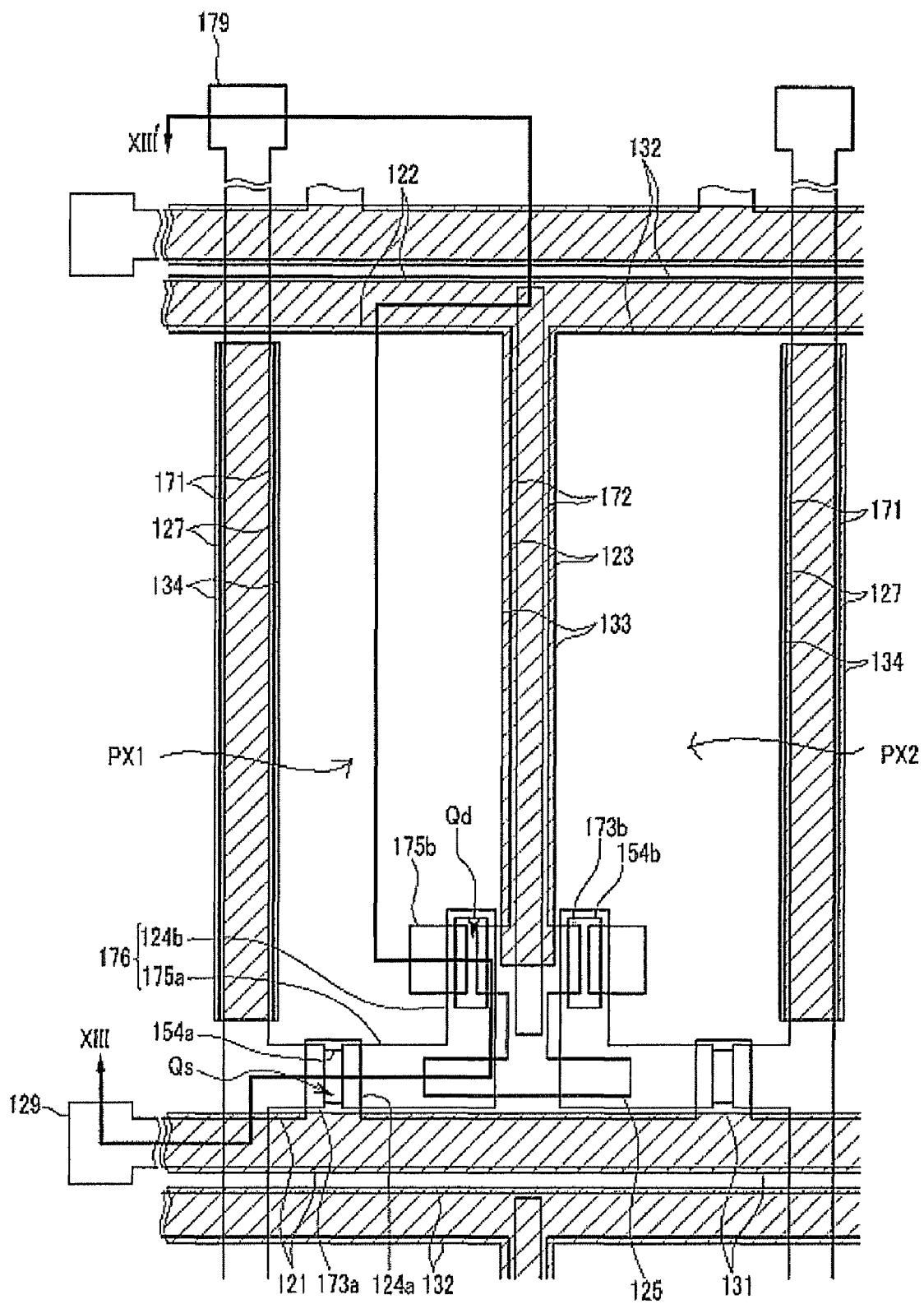
FIG. 12 is a top plan layout view of a step in a method for manufacturing an exemplary embodiment of an OLED display according to the present invention.
Figure 13:
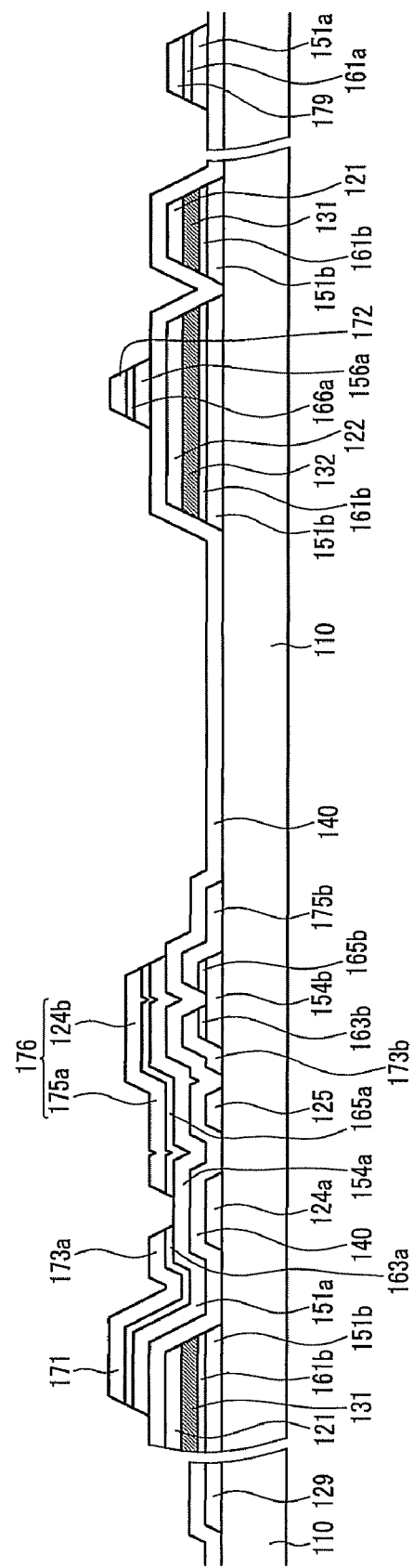
FIG. 13 is a cross-sectional view of the exemplary embodiment of an OLED display shown in FIG. 12 taken along line XIII-XIII'.

As shown in FIG. 12 and FIG. 13, a pair of ohmic contacts 163a and 165a are formed by removing the exposed region of the impurity-doped amorphous silicon pattern 164a using the date line 171, the switching input electrode 173a and the coupling electrode 176 as masks.

Figure 14:
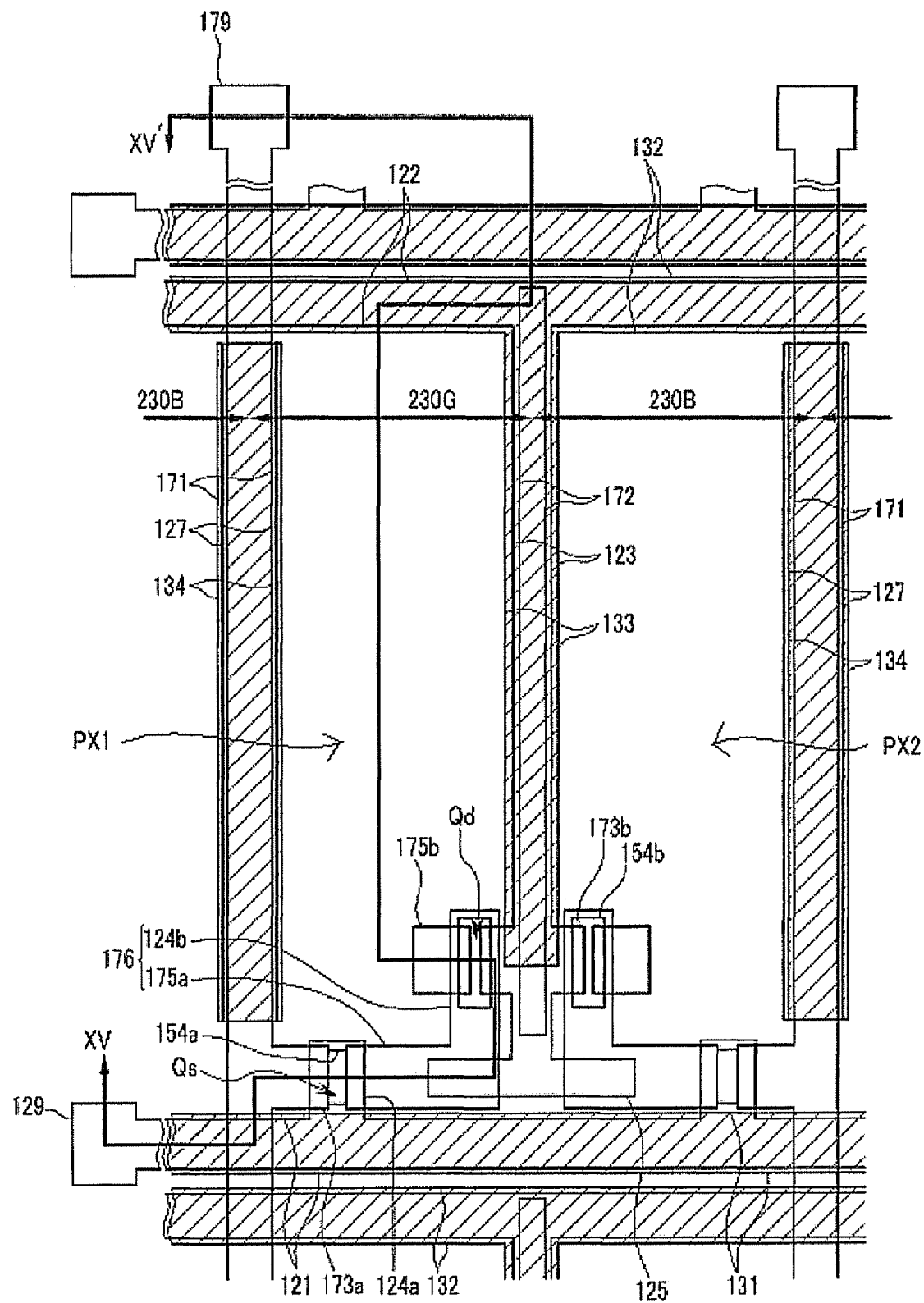
FIG. 14 is a top plan layout view of a step in a method for manufacturing an exemplary embodiment of an OLED display according to the present invention.
Figure 15:
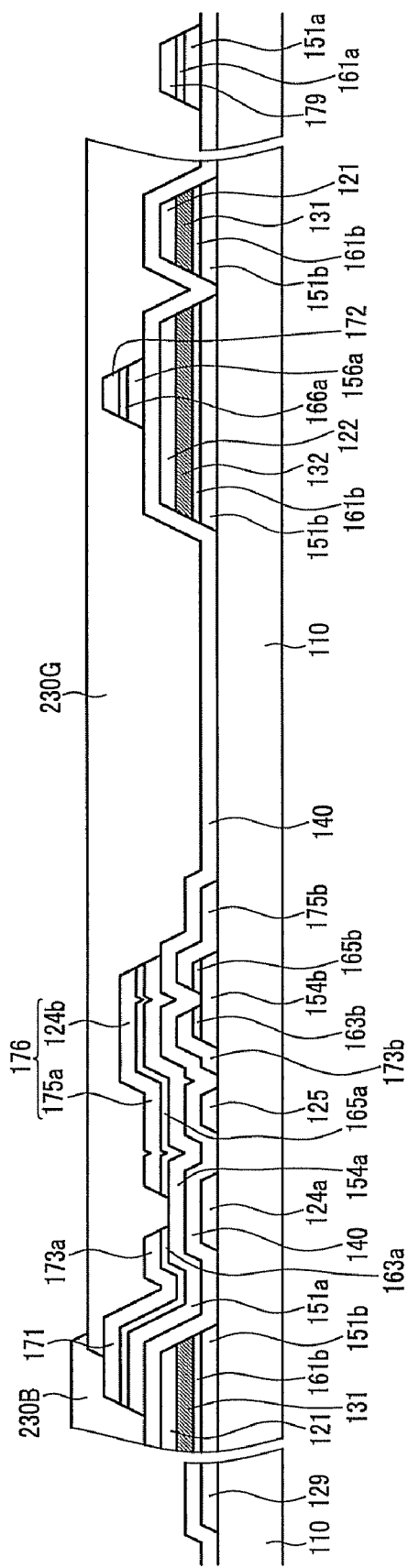
FIG. 15 is a cross-sectional view of the exemplary embodiment of an OLED display shown in FIG. 14 taken along line XV-XV'.

As shown in FIG. 14 and FIG. 15, color filters 230G and 230B are coated on the data line 171, the coupling electrode 176, the driving voltage assistant 172, and the substrate 110. In order to form the exemplary embodiment of a pixel arrangement shown in FIG. 4, the color filters 230G and 230B may be formed as follows. A red filter is formed at the red pixel (R), a green filter is formed at the green pixel (G), and a blue filter is formed at the blue pixel (B). Furthermore, at the white pixel (W), no filter may be formed or a transparent insulating layer may be formed.

Figure 16:
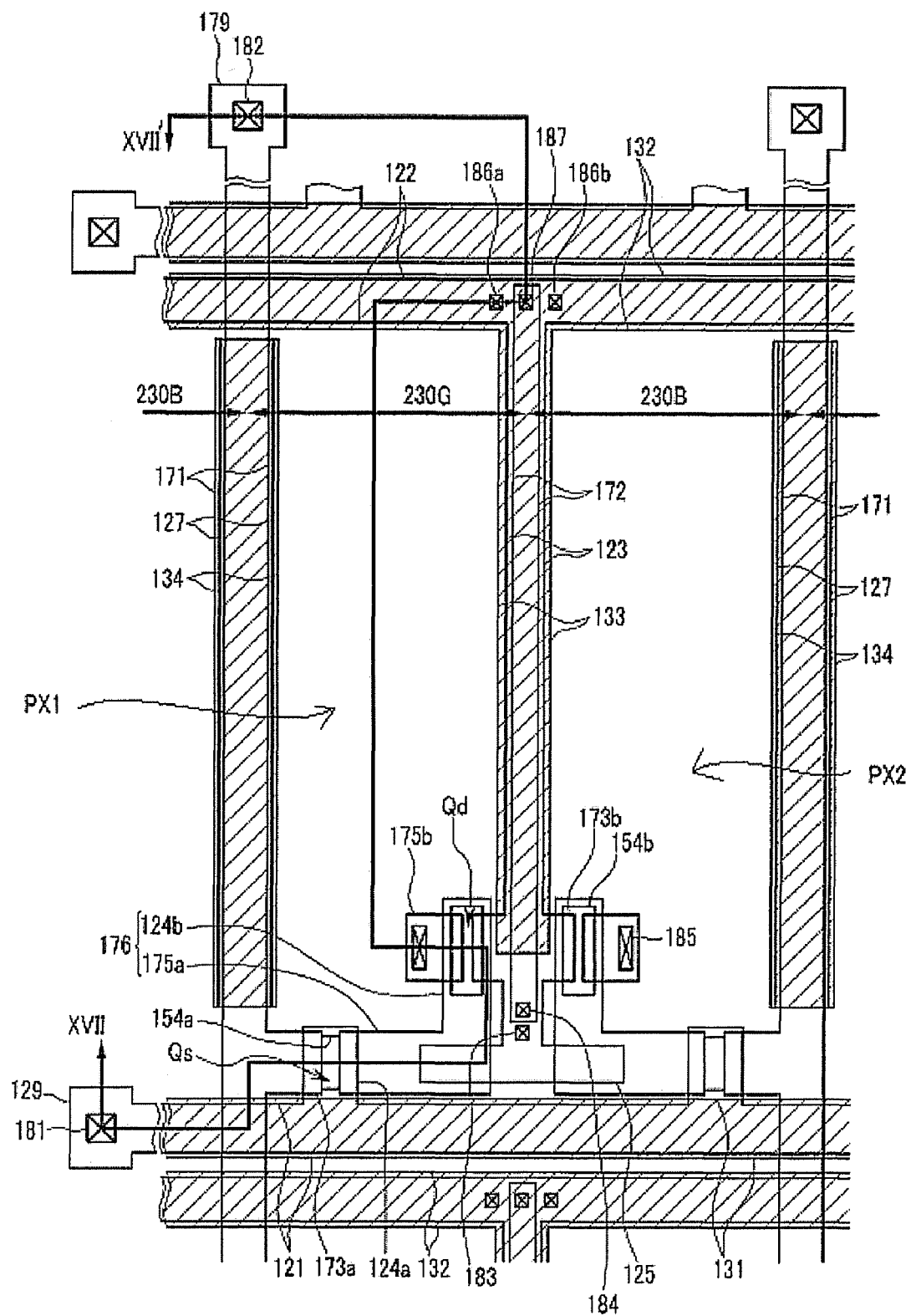
FIG. 16 is a top plan layout view of a step in a method for manufacturing an exemplary embodiment of an OLED display according to the present invention.
Figure 17:
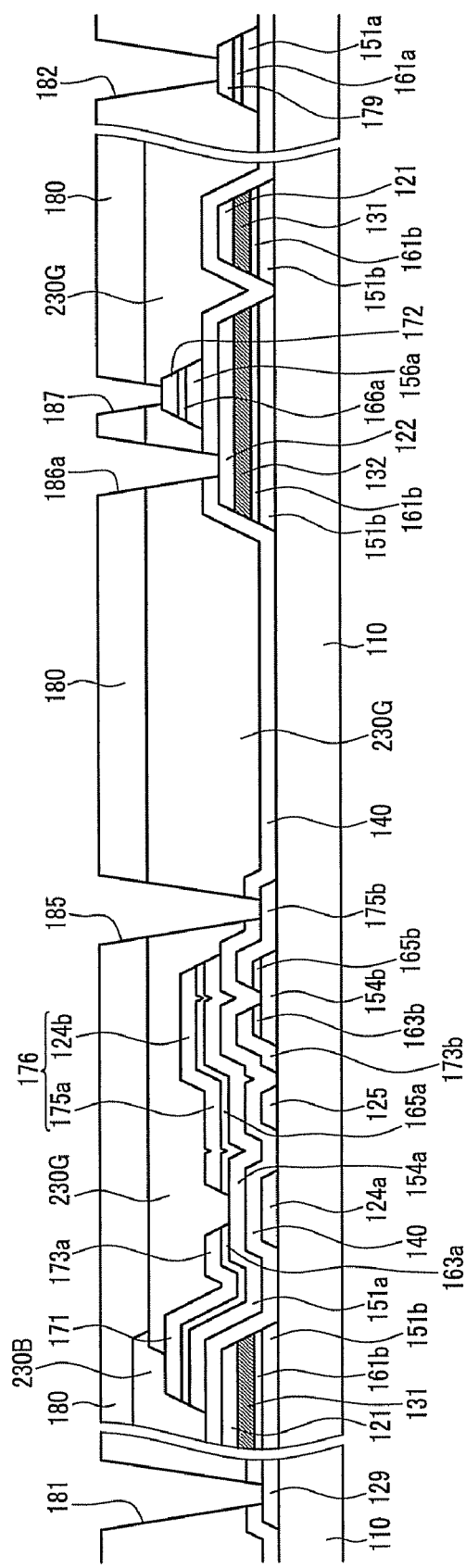
FIG. 17 is a cross-sectional view of the exemplary embodiment of an OLED display shown in FIG. 16 taken along line XVII-XVII'.

As shown FIG. 16 and FIG. 17, a passivation layer 180 is deposited on the color filters 230G and 230B, and a plurality of contact holes 181, 182, 183, 184, 185, 186a, 186b, and 187 are formed by photolithography and etching the passivation layer 180.

Figure 18:
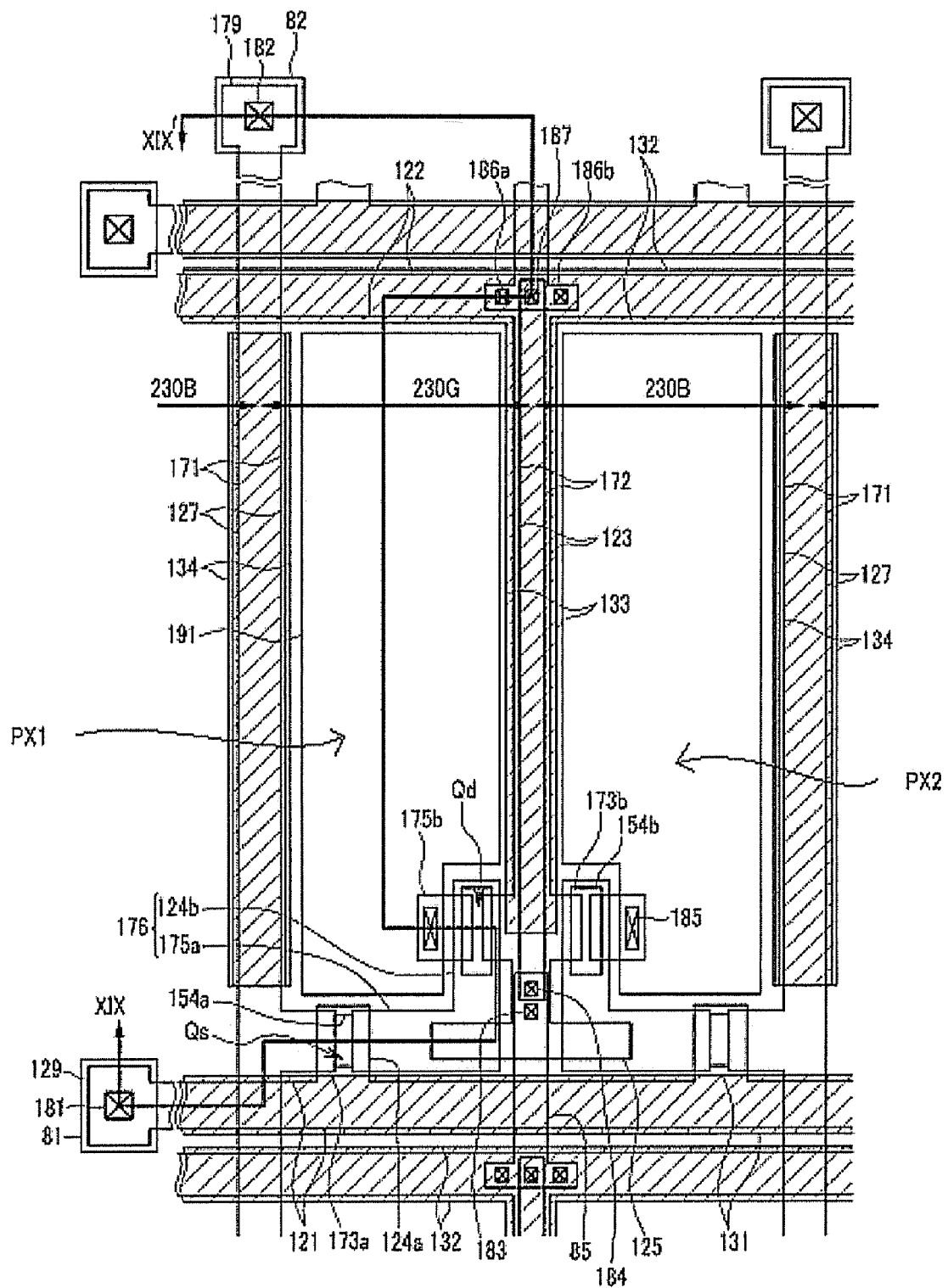
FIG. 18 is a top plan layout view of a step in a method for manufacturing an exemplary embodiment of an OLED display according to the present invention.
Figure 19:
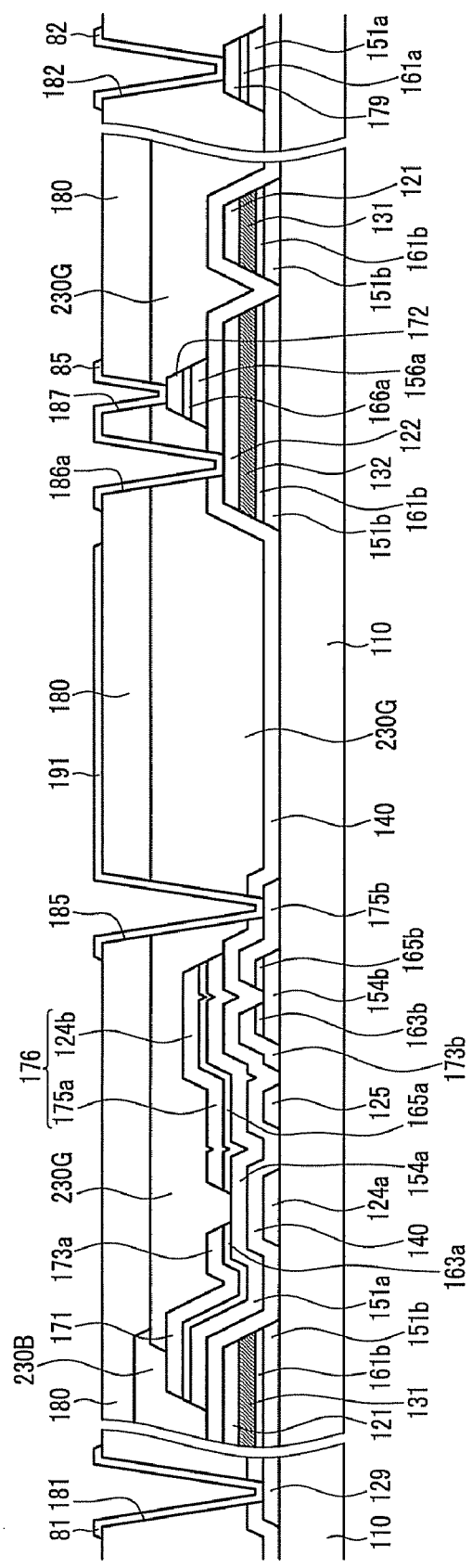
FIG. 19 is a cross-sectional view of the exemplary embodiment of an OLED display shown in FIG. 18 taken along line XIX-XIX'.

As shown in FIG. 18 and FIG. 19, a transparent conductive layer, exemplary embodiments of which may be made of ITO or IZO, is deposited on the passivation layer 180, and a pixel electrode 191, an overpass 85, and contact assistants 81 and 82 are formed by photo-etching the transparent conductive layer.

As shown in FIG. 2 and FIG. 3, a photosensitive organic layer is coated on the pixel electrode 191, the overpass 85, and the passivation layer 180, and an insulating bank 361 having a plurality of openings 365 is formed by exposing and developing the photosensitive organic layer.

Then, light emitting members each having an emitting layer 370 and an auxiliary layer (not shown) are formed in the openings 365. The light emitting members may be formed through a solution process such as an inkjet printing method, or deposition. The emitting layer 370 emits a white light by combining light with different wavelengths emitted from sub-emitting layers 370p, 370q, and 370r which are vertically or horizontally formed as described above.

Finally, a common electrode 270 is formed on the insulating bank 361 and the light emitting members.

Hereinafter, another exemplary embodiment of an OLED display according to the present invention will be described with reference to FIG. 20 and FIG. 21.

Figure 20:
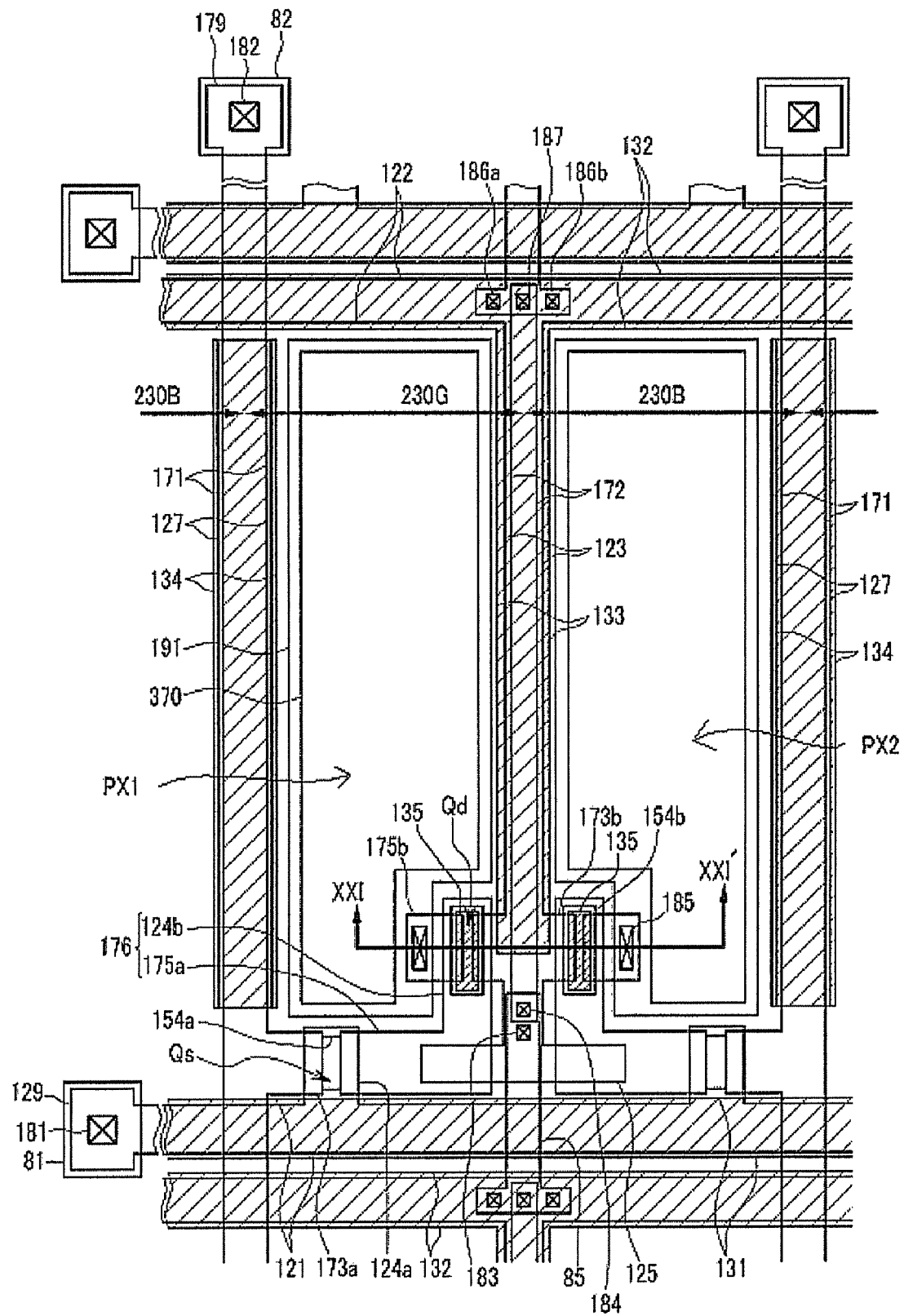
FIG. 20 is a top plan layout view illustrating another exemplary embodiment of an OLED display according to the present invention.
Figure 21:
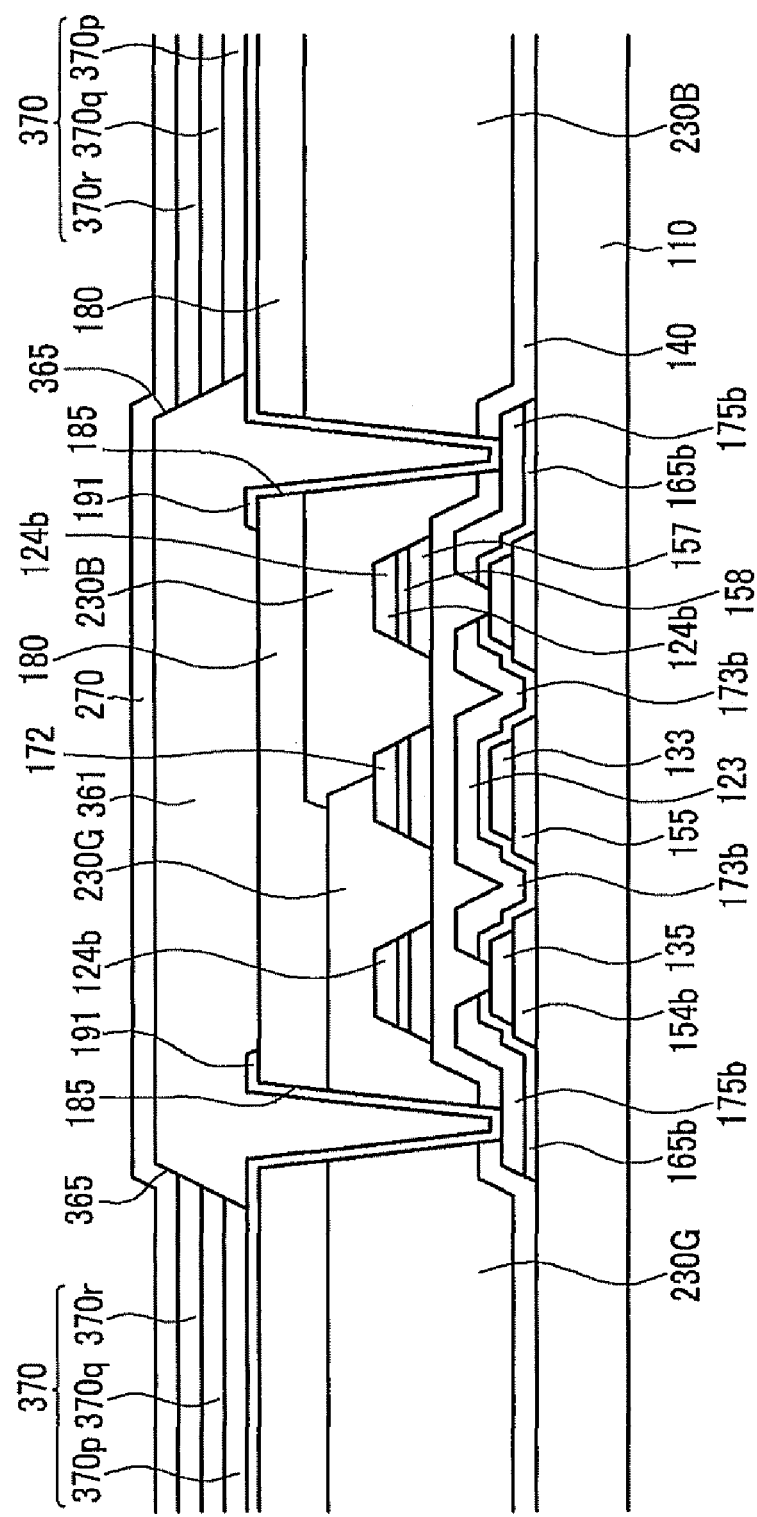
FIG. 21 is a cross-sectional view of the exemplary embodiment of an OLED display of FIG. 20 taken along line XXI-XXI'.

FIG. 20 is a top plan layout view illustrating another exemplary embodiment of an OLED display according to the present invention, and FIG. 21 is a cross-sectional view of the exemplary embodiment of an OLED display of FIG. 20 taken along line XXI-XXI'.

As shown in FIG. 20 and FIG. 21, the present exemplary embodiment of an OLED display has a structure similar to the aforementioned exemplary embodiment of an OLED display. For purposes of clarity, the same reference numerals will be used to refer to similar structures.

A driving semiconductor 154b, exemplary embodiments of which are made of microcrystalline or polycrystalline silicon, and a plurality of semiconductor members 155 separated from the driving semiconductor 154b are formed on an insulating substrate 110.

An etch stopper 135 is formed on a predetermined region of the driving semiconductor 154b. The etch stopper 135 is formed to be narrower than the driving semiconductor 154b, and the driving semiconductor 154b is exposed at both sides of the etch stopper 135.

A plurality of light blocking members 131, 132, 133 and 134 are formed on the plurality of semiconductor members 155. The light blocking members 131 and 132 extend in a substantially horizontal direction, and the light blocking member 132 includes the light blocking member 133 which extends in a substantially vertical direction protruding from the light blocking member 132. The light blocking member 134 extends in a substantially vertical direction.

The light blocking members 131, 132, 133 and 134 have a plane shape substantially identical to the semiconductor members 155.

A plurality of gate lines 121 having a plurality of switching control electrodes 124a and end portions 129, a plurality of driving voltage lines 122 having a plurality of extensions 123, a driving input electrode 173b, a storage capacitive conductor 125, a plurality of driving output electrodes 175b, and a plurality of assistants member 127 are formed on the driving semiconductor 154b, the etch stopper 135, and the light blocking members 131, 132, 133, and 134.

Ohmic contacts 163b and 165b, exemplary embodiments of which are made of impurity-doped crystalline silicon, are formed between the driving input electrode 173b and the driving semiconductor 154b, and between the driving output electrode 175b and the driving semiconductor 154b.

A gate insulating layer 140 is formed on the gate line 121, the driving voltage line 122, the driving output electrode 175b, and the assistant member 127.

A plurality of linear semiconductors (not shown) having a switching semiconductor 154a and a semiconductor member 157 are formed on the gate insulating layer 140.

The semiconductor member 157 is formed on the extension 123 of the driving voltage line 122, the driving input electrode 173b, and the driving output electrode 175b to overlap one another.

A data line 171 having a plurality of switching input electrodes 173a and end portions 179, a plurality of coupling electrodes 176 having a switching output electrode 175a and a driving control electrode 124b, and a plurality of driving voltage assistants 172 are formed on the linear semiconductor, the semiconductor member 157, and the gate insulating layer 140.

Impurity semiconductor members 158 are formed between the data line 171 and the linear semiconductor, between the coupling electrode 176 and the linear semiconductor, and between the driving voltage assistant 172 and the semiconductor member 157.

Color filters 230B and 230G are formed on the date line 171, the coupling electrode 176, and the driving voltage assistant 172. A passivation layer 180 having a plurality of contact holes 181, 182, 183, 184, 185, 186a, 186b and 187 is formed on the color filters 230B and 230G. A plurality of pixel electrodes 191, a plurality of overpasses 85, and a plurality of contact assistants 81 and 82 are formed on the passivation layer 180.

An insulating bank 361 is formed on the pixel electrode 191, the overpass 85, and the contact assistants 81 and 82. An organic light emitting member including an emitting layer 370 having sub-emitting layers 370p, 370q and 370r and an auxiliary layer (not shown) is formed in the opening 365 on a pixel electrode 191 defined by the insulating bank 361.

A common electrode 270 is formed on the organic light emitting member.

As described above, the present exemplary embodiment of an OLED display includes the etch stopper 135 formed on the driving semiconductor 154b. The etch stopper 135 prevents the driving semiconductor 154b from being removed or damaged when the etching process is performed during the formation of the ohmic contacts 163b and 165b.

As described above, a data voltage is prevented from being reduced in the switching TFT due to TFT degradation. Also, a reduction of the amount of current transferred to a light emitting device, a shortening of lifetime of the OLED, and a degradation of displaying characteristics of an OLED display are prevented. Furthermore, the manufacturing process thereof can be simplified by reducing the number of masks through integrating common layers in during the construction of a display using TFTs having varying structures. In addition, the contrast ratio may be enhanced by reducing reflection of external light.

While this invention has been described in connection with what is presently considered to be practical exemplary embodiments, it is to be understood that the present invention is not limited to the disclosed exemplary embodiments herein, but, on the contrary, is intended to cover various modifications and equivalent arrangements included within the spirit and scope of the appended claims.

What is claimed is:

1. An organic light emitting diode display comprising:
   a substrate;
   a gate line formed on the substrate;
   a data line formed to intersect with the gate line;
   a driving voltage line including a portion parallel to at least one of the gate line and the data line;
   a light blocking member formed under the gate line, the data line, and the driving voltage line, and the gate line, the data line and the driving voltage line substantially overlapping the light blocking member, wherein the light blocking member has substantially a same shape as portions of the gate line, the data line, and the driving voltage line aligned with the light blocking member;
   a switching thin film transistor connected to the gate line and the data line and including an amorphous semiconductor;
   a driving thin film transistor connected to the switching thin film transistor and including a crystalline semiconductor; and
   a light emitting diode connected to the driving thin film transistor.

2. The organic light emitting diode display of claim 1, wherein the light blocking member comprises at least one of a first layer including an opaque conductive material and a second layer including an oxide of the opaque conductive material.

3. The organic light emitting diode display of claim 2, wherein the opaque conductive material is chromium (Cr).

4. The organic light emitting diode display of claim 1, wherein the switching thin film transistor further comprises a switching control electrode connected to the gate line, a switching input electrode connected to the data line, and a switching output electrode connected to the driving thin film transistor,
   wherein the driving thin film transistor further comprises a driving control electrode connected to the switching output electrode, a driving input electrode connected to the driving voltage line, and a driving output electrode connected to a pixel electrode, wherein the amorphous semiconductor is formed on the switching control electrode, and wherein the crystalline semiconductor is formed under the driving control electrode.

5. An organic light emitting diode display comprising:
a substrate;
a light blocking member formed on the substrate;
a gate line formed on the light blocking member and including a switching control electrode;
a first amorphous semiconductor formed on the switching control electrode;
a data line including a switching input electrode, wherein the switching input electrode contacts the first amorphous semiconductor, and a switching output electrode which faces the switching input electrode;
a driving control electrode connected to the switching output electrode;
a first crystalline semiconductor formed on the substrate;
a driving voltage line including a driving input electrode, wherein the driving input electrode contacts the first crystalline semiconductor, and a driving output electrode which faces the driving input electrode;
a pixel electrode connected to the driving output electrode;
a common electrode which faces the pixel electrode; and
a light emitting member disposed between the pixel electrode and the common electrode,
wherein the light blocking member has substantially a same shape as portions of the gate line, the data line, and the driving voltage line aligned with the light blocking member.

6. The organic light emitting diode display of claim 5, wherein the light blocking member comprises at least one of a first layer including an opaque conductive material and a second layer including an oxide of the opaque conductive material.

7. The organic light emitting diode display of claim 6, wherein the opaque conductive material is chromium (Cr).

8. The organic light emitting diode display of claim 5, further comprising a second crystalline semiconductor formed under the light blocking member and having substantially the same shape as the light blocking member.

9. The organic light emitting diode display of claim 5, wherein the first amorphous semiconductor is disposed between the switching input electrode and the switching output electrode.

10. The organic light emitting diode display of claim 5, further comprising an etch stopper formed on the first crystalline semiconductor, wherein the etch stopper includes substantially the same material as the light blocking member.

11. The organic light emitting diode display of claim 5, further comprising a color filter formed between the substrate and the pixel electrode.

12. The organic light emitting diode display of claim 11, wherein the light emitting member comprises a plurality of light emitting layers, wherein each of the plurality of light emitting layers emit light of a different wavelength.

13. The organic light emitting diode display of claim 12, wherein the different wavelengths of light are combined to form white light.

14. The organic light emitting diode display of claim 5, further comprising an extension of the driving voltage line which is connected to the driving voltage line.

15. The organic light emitting diode display of claim 14, further comprising a second amorphous semiconductor formed under the extension of the driving voltage line, wherein the second amorphous semiconductor has substantially the same shape as the auxiliary driving voltage line.

16. The organic light emitting diode display of claim 15, wherein the gate line, the driving voltage line, and the driving output electrode are formed at the same time.

17. The organic light emitting diode display of claim 16, wherein the switching output electrode, the driving control electrode, and the auxiliary driving voltage line are formed at the same time.

18. An organic light emitting diode display comprising a first pixel and a second pixel adjacent to the first pixel,
wherein the first pixel comprises:
a first switching thin film transistor connected to a gate line and a first data line;
a first driving thin film transistor connected to the first switching thin film transistor and a driving voltage line; and
a first light emitting diode connected to the first driving thin film transistor,
wherein the second pixel comprises:
a second switching thin film transistor connected to the gate line and a second data line;
a second driving thin film transistor connected to the second switching thin film transistor and the driving voltage line; and
a second light emitting diode connected to the second driving thin film transistor,
wherein a light blocking member is formed under the gate line, the first data line, the second data line, and the driving voltage line and has substantially a same shape as portions of the gate line, the data line and the driving voltage line aligned with the light blocking member.

19. The organic light emitting diode display of claim 18, wherein
at least one of the first switching thin film transistor and the second switching thin film transistor comprise an amorphous semiconductor,
and at least one of the first driving thin film transistor and the second driving thin film transistor comprise a crystalline semiconductor.

20. The organic light emitting diode display of claim 19, wherein the driving voltage line comprises:
a first portion formed substantially parallel to the gate line; and
a second portion which projects from the first portion and is disposed between the first and second data lines,
wherein the first driving thin film transistor and the second driving thin film transistor are connected to the second portion.

21. The organic light emitting diode display of claim 20, wherein the first pixel and the second pixel are disposed substantially symmetrically with respect to the second portion of the driving voltage line.

22. The organic light emitting diode display of claim 18, wherein at least one of the first pixel and the second pixel further comprises a color filter formed under at least one of the first light emitting diode and the second light emitting diode.

23. The organic light emitting diode display of claim 22, wherein at least one of the first light emitting diode and the second light emitting diode emit white light.

* * * * *